United States Patent
Larson et al.

(10) Patent No.: US 11,824,497 B2
(45) Date of Patent: *Nov. 21, 2023

(54) MICROWAVE PHOTOCONDUCTANCE SPECTROMETER AND METHODS OF USING THE SAME

(71) Applicants: Alliance for Sustainable Energy, LLC, Golden, CO (US); The Regents of the University of Colorado, Denver, CO (US)

(72) Inventors: Bryon William Larson, Golden, CO (US); Obadiah G. Reid, Ft. Collins, CO (US)

(73) Assignees: Alliance for Sustainable Energy, LLC, Golden, CO (US); The Regents of the University of Colorado, Denver, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/052,751

(22) Filed: Nov. 4, 2022

(65) Prior Publication Data
US 2023/0070273 A1    Mar. 9, 2023

Related U.S. Application Data

(63) Continuation of application No. 17/047,721, filed as application No. PCT/US2019/030078 on Apr. 30, 2019, now Pat. No. 11,563,405.
(Continued)

(51) Int. Cl.
*H02S 50/10* (2014.01)
*G01R 31/265* (2006.01)

(52) U.S. Cl.
CPC .......... *H02S 50/10* (2014.12); *G01R 31/2656* (2013.01)

(58) Field of Classification Search
CPC . H02S 50/10; G01R 31/2656; G01R 31/2648; G01R 31/308; G01N 22/00; Y02E 10/50
(Continued)

(56) References Cited

U.S. PATENT DOCUMENTS 3,939,415 A    2/1976    Terawawa
4,949,034 A    8/1990    Imura et al.
(Continued)

FOREIGN PATENT DOCUMENTS

EP    2735864 A1    5/2014
WO    9211528    7/1992

OTHER PUBLICATIONS

Ahrenkiel, R.K. et al., "Lifetime analysis of silicon solar cells by microwave reflection," Solar Energy Materials and Solar Cells, vol. 92, 2008, 6 pages.
(Continued)

*Primary Examiner* — Alesa Allgood
*Assistant Examiner* — Byung Ro Lee
(74) *Attorney, Agent, or Firm* — Michael A. McIntyre

(57) ABSTRACT

A steady-state microwave conductivity method whereby a light beam is modulated to form an amplitude modulated light having a modulation frequency $\omega_1$. The method further includes producing a microwave waveform, exposing a sample to the amplitude modulated light and a first portion of the microwave waveform to produce an amplitude modulation signal on the first portion of the microwave waveform, and mixing a second portion of the microwave waveform and the amplitude modulation signal to produce a first signal and a second signal.

18 Claims, 14 Drawing Sheets

Related U.S. Application Data

(60) Provisional application No. 62/664,498, filed on Apr. 30, 2018.

(58) Field of Classification Search
USPC .................................................. 324/761.01
See application file for complete search history.

(56) References Cited

U.S. PATENT DOCUMENTS

| | | | |
|---|---|---|---|
| 5,049,816 | A | 9/1991 | Moslehi |
| 5,081,414 | A | 1/1992 | Kusama et al. |
| 5,381,005 | A | 1/1995 | Chazelas et al. |
| 5,406,214 | A | 4/1995 | Boda et al. |
| 5,451,886 | A | 9/1995 | Ogita et al. |
| 6,275,060 | B1 | 8/2001 | Ahrenkiel et al. |
| 6,369,603 | B1 | 4/2002 | Johnston et al. |
| 6,473,048 | B1 | 10/2002 | Diaz |
| 8,581,613 | B2 | 11/2013 | Ahrenkiel et al. |
| 2006/0152229 | A1 | 7/2006 | Ju |
| 2010/0060307 | A1* | 3/2010 | Kamieniecki ...... G01R 31/2648 324/754.21 |
| 2011/0273705 | A1 | 11/2011 | Rao et al. |
| 2011/0301892 | A1 | 12/2011 | Kamieniecki |
| 2013/0257472 | A1 | 10/2013 | Kamieniecki |
| 2016/0248375 | A1* | 8/2016 | Ito ..................... G01N 21/1717 |

OTHER PUBLICATIONS

Avery, A. et al., "Tailored semiconducting carbon nanotube networks with enhanced thermoelectric properties," Nature Energy, vol. 1, 2016, 9 pages.
Basore, P.A. and Hansen, B.R., "Microwave-Detected Photoconductance Decay," Sandia National Laboratories, IEEE, 1990, 6 pages.
Bindl, D. et al., "Free Carrier Generation and Recombination in Polymer-Wrapped Semiconducting Carbon Nanotube Films and Heterojunctions," Journal of Phys. Chem. Letters, vol. 4, 2013, 10 pages.
Buchaca-Domingo, E. et al., "Additive-assisted supramolecular manipulation of polymer:fullerene blend phase morphologies and its influence on photophysical processes," RSC Materials Horizons, vol. 1, 2014, 10 pages.
Cunningham, P.D. et al., "Charge Trapping and Exciton Dynamics in Large-Area CVD Grown MoS2," Journal of Physical Chemistry C, vol. 120, 2016, 8 pages.
Door, Gerald, "Photogeneration and dynamics of charge carriers in the conjugated polymer poly (3-hexylthiophene)," published and distributed by DUP Science, Technische Universiteit Delft, Delft University Press, The Netherlands, 2004, 144 pages (saved in Worldox and uploaded into EFS-Web in two parts due to size).
Dowgiallo, A.M. et al., "Ultrafast Spectroscopic Signature of Charge Transfer between Single-Walled Carbon Nanotubes and C60," vol. 8, No. 8, 2014, 9 pages.
Dunn, H.K. et al., "In Situ Detection of Free and Trapped Electrons in Dye-Sensitized Solar Cells by Photo-Induced Microwave Reflectance Measurements," Journal of Physical Chemistry C, vol. 116, 2012, 10 pages.
Ellerbruch, D.A., "Evaluation of a Microwave Phase Measurement System," Journal of Research of the National Bureau of Standards-C. Engineering and Instrumentation, vol. 69C, No. 1, Jan.-Mar. 1965, 11 pages.
Ferguson, A. et al., "Trap-limited carrier recombination in single-walled carbon nanotube heterojunctions with fullerene acceptor layors," Physical Review B, vol. 91, 2015, 8 pages.
Ferguson, A. et al., "Efficiency of Charge-Transfer Doping in Organic Semiconductors Probed with Quantitative Microwave and Direct-Current Conductance," Journal of Phys. Chem. Letters, vol. 9, 2018, 7 pages.
Gutierrez, H.R. et al., "Extraordinary Room-Temperature Photoluminescence in Triangular WS2 Monolayers," Nano Letters, vol. 13, 2013, 8 pages.
Hygate, G. et al., "Measuring microwave fields directly with an optically modulated scatterer," Measurement Science and Technology, vol. 1, 1990, 8 pages.
Ichimura, M. et al., "Characterization of Si wafers by μ-PCD with surface electric field," Materials Science and Engineering B73, 2000, 5 pages.
Chimura, M. et al., "Bulk carrier lifetime measurement by the microwave reflectance photoconductivity decay method with external surface electric field," Applied Physics Letters, vol. 80, No. 23, 2002, 3 pages.
Ihly, R. et al., "Tuning the driving force for exciton dissociation in single-walled carbon nanotube heterojunctions," Nature Chemistry, vol. 8, 2016, 7 pages.
Kang, H.S. et al., "Long-Lived Charge Separation at Heterojunctions between Semiconducting Single-Walled Carbon Nanotubes and Perylene Diimide Electron Acceptors," Journal of Physical Chemistry C, vol. 122, 2018, 12 pages.
Kuwayama, T. et al., "Interface recombination velocity of silicon-on-insulator wafers measured by microwave reflectance photoconductivity decay method with electric field," Applied Physics Letters, vol. 83, No. 5, 2003, 3 pages.
Labram, J.G. et al., "Steady-state microwave conductivity reveals mobility-lifetime product in methylammonium lead iodide," Applied Physics Letters, vol. 113, 2018, 5 pages.
Li, Y. et al., "Giant two-photon absorption in monolayer MoS2," Laser Photonics Rev. 9, No. 4, 2015, 8 pages.
Lin, M.Z. et al., "A top loading, very low-temperature, X-band, microwave spectrometer," Rev. Sci. Instrum. vol. 61, No. 5, 1990, 6 pages.
Macleod, B.A. et al., "Large n-and p-type thermoelectric power factors from doped semiconducting single-walled carbon nanotube thin films," RSC Energy & Environmental Science, vol. 10, 2017, 12 pages.
Miyazaki, M. et al., "Measurement of Minority Carrier Recombination Lifetime in Silicon Wafers by Measurement of Photoconductivity Decay by Microwave Reflectance: Result of Round Robin Test," Recombination Lifetime Measurements in Silicon, ASTM STP 1340, Gupta, Bacher, and Hughes Eds., American Society for Testing and Materials, 1998, 20 pages.
Molas, M. R. et al., "The optical response of monolayer, few-layer and bulk tungsten disulfide," RSC Nanoscale, vol. 9, 2017, 14 pages.
Murasawa, K. et al., "Measurement of optical-beat frequency in a photoconductive terahertz-wave generator using microwave higher harmonics," Review of Scientific Instruments, vol. 82, 2011, 7 pages.
Nilges, M.J. et al., "Electron Paramagnetic Resonance W-band Spectrometer with a Low-Noise Amplifier," Applied Magnetic Resonance, vol. 16, 1999, 17 pages.
O'Connor, B.T. et al., "Morphological Origin of Charge Transport Anisotropy in Aligned Polythiophene Thin Films," Advanced Functional Materials, vol. 24, 2014, 10 pages.
Pace, N. et al., "Delocalization Drives Free Charge Generation in Conjugated Polymer Films," ACS Energy Letters, vol. 3, 2018, 7 pages.
Radisavljevic, B. et al., "Mobility engineering and a metal-insulator transition in monolayer MoS2," Nature Materials, vol. 12, 2013, 6 pages.
Reid, O. et al., "Nanostructure determines the intensity-dependence of open-circuit voltage in plastic solar cells," Journal of Applied Physics, vol. 108, 2010, 8 pages.
Reid, O. et al., "The Influence of Solid-State Microstructure on the Origin and Yield of Long-Lived Photogenerated Charge in Neat Semiconducting Polymers," Wiley Journal of Polymer Science Part B: Polymer Physics, vol. 50, 2012, 11 pages.
Reid, O. et al., "Grain-Size-Limited Mobility in Methylammonium Lead Iodide Perovskite Thin Films," ACS Energy Letters, vol. 1, 2016, 5 pages.
Reid, O. et al., "Quantitative analysis of time-resolved microwave conductivity data," IOP Journal of Physics D: Applied Physics, vol. 50, 2017, 13 pages.

(56) References Cited

OTHER PUBLICATIONS

Vural, A.M. et al., "A Light-Modulated Scattering Technique for Diffraction Field Measurements," Radio Science Journal of Research, NBS/USNC-URSI, vol. 68D, No. 4, Apr. 1964, 8 pages.
Wegewijs, B. et al., "Charge carrier dynamics in bulk poly(3-hexylthiophene) as a function of temperature," Elsevier Synthetic Metals, vol. 119, 2001, 2 pages.
Zhang, S. et al., "Direct Observation of Degenerate Two-Photon Absorption and Its Saturation in WS2 and MoS2 Monolayer and Few-Layer Films," ACS Nano, vol. 9, No. 7, 2015, 9 pages.
Zhu, B. et al., "Exciton Binding Energy of Monolayer WS2," Scientific Reports, vol. 5:9218, 2015, 5 pages.
Zhu, T. et al., "Highly mobile charge-transfer excitons in two-dimensional WS2/tetracene heterostructures," Science Advances, Research Article, vol. 4:eaaao3104; 2018, 8 pages.
PCT/US19/30078 International Search Report dated Aug. 20, 2019, 2 pages.
PCT/US19/30078 Written Opinion dated Aug. 20, 2019, 6 pages.
EP 19796586.6 European Search Report for corresponding EU application, dated Jan. 25, 2022, 7 pages.

\* cited by examiner

MICROWAVE PHOTOCONDUCTANCE SPECTROMETER AND METHODS OF USING THE SAME

CROSS-REFERENCE TO RELATED APPLICATIONS

This application is a continuation application from U.S. Non-provisional patent application Ser. No. 17/047,721, which is a national stage entry from PCT Patent Application No. PCT/US19/30078, which claims the benefit of U.S. Provisional Application No. 62/664,498 filed Apr. 30, 2018, the contents of which are incorporated herein by reference in their entirety.

CONTRACTUAL ORIGIN

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Microwave absorption measurements are a sensitive method of measuring the photoconductivity of materials. This capability is extremely useful in (e.g.) photovoltaic materials research, as it allows screening and/or characterization of candidate materials without the need to fabricate full photovoltaic devices. However, existing instruments often require expert users, are quite expensive, and can require laborious data analysis. Thus, there remains a need for improved microwave absorption measurement systems and methods, especially in view of rapidly advancing areas in material science, such as perovskites for solar, lighting, water-splitting, and other areas.

SUMMARY

An aspect of the present disclosure is a steady-state microwave conductivity method that includes modulating a light beam to form an amplitude modulated light having a modulation frequency $\omega_1$, producing a microwave waveform, exposing a sample to the amplitude modulated light and a first portion of the microwave waveform to produce an amplitude modulation signal on the first portion of the microwave waveform, mixing a second portion of the microwave waveform and the amplitude modulation signal to produce a first signal and a second signal, converting the first signal and the second signal to a difference signal, and creating a frequency-filtered amplified difference signal based on $\omega_1$, where the frequency-filtered amplified difference signal represents a photoconductivity parameter of the sample.

In some embodiments of the present disclosure, the steady-state microwave conductivity method may further include producing the light beam using a light source that includes at least one of a xenon arc lamp, a supercontinuum laser, and/or a light emitting diode. In some embodiments of the present disclosure, the steady-state microwave conductivity method may further include filtering the light beam produced by the light source to create a filtered light, where the light beam produced by the light has a first bandwidth, and the filtered light has a second bandwidth that is narrower than the first bandwidth. In some embodiments of the present disclosure, the steady-state microwave conductivity method may further include chopping the filtered light to create the amplitude modulated light.

In some embodiments of the present disclosure, the exposing may include placing the sample in a microwave resonator. In some embodiments of the present disclosure, the exposing may include impinging the microwave waveform onto the sample using an antenna and receiving the amplitude modulation signal using the antenna. In some embodiments of the present disclosure, the steady-state microwave conductivity method may further include splitting the amplitude modulated light into a first portion and a second portion, directing the first portion to a reference photodiode, and directing the second portion to the sample, where the first portion may be between 5% and 15%, and the reference photodiode produces a frequency reference signal proportional to $\omega_1$.

In some embodiments of the present disclosure, the steady-state microwave conductivity method may further include splitting the microwave waveform into the first portion of the microwave waveform and the second portion of the microwave waveform, directing the first portion of the microwave waveform through a first isolator to the sample, and directing the second portion of the microwave waveform through a second isolator to the magic tee. In some embodiments of the present disclosure, the steady-state microwave conductivity method may further include amplitude modulating the microwave waveform to a modulation frequency $\omega_2$ to produce an amplitude modulated waveform.

In some embodiments of the present disclosure, the steady-state microwave conductivity method may further include calculating the photoconductivity parameter as a photoconductance $\Delta G$. In some embodiments of the present disclosure, $\Delta G$ may be determined by, $$\Delta G = -\frac{1}{K}\frac{\Delta P}{P},$$

where K is a sensitivity factor of the microwave cavity, $\Delta P$ is a first microwave power reflected from at least one of the sample, the microwave resonator, and/or the antenna, and P is a second microwave power reflected from at least one of the sample, the microwave resonator, and/or the antenna. In some embodiments of the present disclosure, the calculating may include plotting $\Delta G$ versus a wavelength of the amplitude modulated light. In some embodiments of the present disclosure, $\omega_2$ may be between about 1 GHz and 100 GHz. In some embodiments of the present disclosure, $\omega_2$ may be between about 8.2 GHz and about 12.4 GHz.

DRAWINGS

Some embodiments are illustrated in referenced figures of the drawings. It is intended that the embodiments and figures disclosed herein are to be considered illustrative rather than limiting.

REFERENCE NUMBERS

Figure 1A:
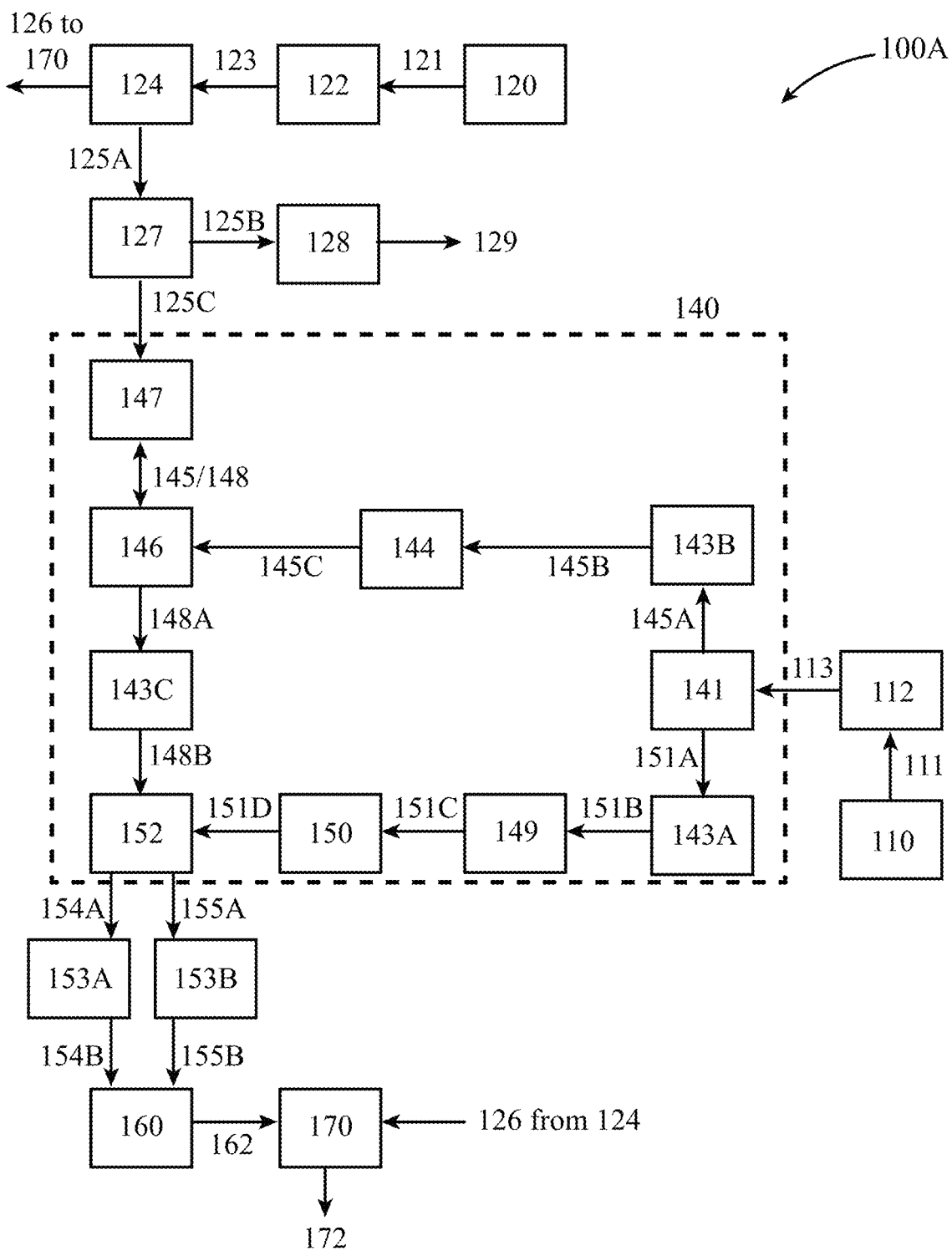
FIG. 1A illustrates a block diagram of a steady-state microwave conductivity (SSMC) system suitable for batch sampling, according to some embodiments of the present disclosure.

| | |
|---|---|
| 100 | steady-state microwave conductivity (SSMC) system |
| 110 | microwave (MW) source |
| 111 | MW signal in coaxial cable |
| 112 | waveguide-to-coaxial transition |
| 113 | MW in rectangular waveguide |
| 120 | light source |
| 121 | light beam |
| 122 | tuneable filter |
| 123 | filtered light |
| 124 | chopper |
| 125 | chopped light |
| 126 | frequency reference signal (voltage, from chopper) |
| 127 | 90/10 beam splitter |
| 128 | reference photodiode |
| 129 | reference measurement of light intensity (voltage) |
| 140 | homodyne circuit |
| 141 | E-plane tee |
| 143 | isolator |
| 144 | 90-degree waveguide twist |
| 145 | MW path to sample |
| 146 | circulator |
| 147 | sample cavity (microwave resonator) |
| 148 | MW path to detectors |
| 149 | variable attenuator |
| 150 | variable phase-shifter |
| 151 | reference MW path |
| 152 | magic tee |
| 153 | crystal diode detector |
| 154 | signal channel A |
| 155 | signal channel B |
| 160 | differential voltage amplifier |
| 162 | difference signal |
| 170 | lock-in amplifier |
| 172 | frequency-filtered amplified difference signal |
| 180 | antenna |
| 185 | film |
| 190 | conveyer |
| 191 | roller |
| 192 | substrate |
| 193 | ink |
| 194 | coating head |
| 200 | transiet microwave conductivity (TMC) system |
| 210 | dirty box |
| 211 | pulsed coherent light source |
| 212 | pulsed light |
| 214 | oscilloscope |
| 215 | amplified signal voltage |
| 216 | filtered line power (AC) |
| 220 | tunable DC voltage supply |
| 225 | DC tuning voltage |
| 226 | Filtered DC tuning voltage |
| 227 | microwave signal in coaxial cable |
| 228 | trigger voltage from laser |
| 229 | DC power |
| 230 | filtered DC power |
| 231 | signal voltage |
| 240 | Faraday cage |
| 242 | AC/DC converter |
| 243 | EM interference filter (low-pass) |
| 244 | microwave source (voltage controlled oscillator) |
| 245 | broadband voltage amplifier |
| 250 | iris and window |
| 251 | thin-film sample |
| 252 | grid reflector and quartz window |
| 253 | change in microwave power |

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

Definitions

Waveguide-to-coaxial transition 112—a shorted section of waveguide with an antenna mounted in one end, coupled to a coaxial connector. Allows microwave power to be coupled between a rectangular waveguide and coaxial transmission lines.

Homodyne circuit 140—an RF/microwave device that uses a common source for the carrier waveform of the local oscillator and the signal inputs of a terminal mixer; provides amplitude de-modulation of the signal input.

Isolator 143—acts as a one-way gate for microwave propagation.

Magic tee 152—a four-port waveguide structure with two input arms and two output arms. It mixes the two input waveforms in a phase-sensitive manner, such that two input waveforms that are in-phase and of equal amplitude will result in all the power being directed to a single output arm (constructive interference) while the other output arm receives zero power (destructive interference). Two input waveforms of equal amplitude that are 90-degrees out of phase result in equal power in the two output arms.

90-degree waveguide twist 144—rotates the polarization axis of the microwave waveform (and waveguide structure) by 90 degrees.

Microwave path to sample 145—microwaves are carried by rectangular waveguide made from drawn copper tubing with brass flanges.

Circulator 146—a three-port microwave device that allows transmission in one direction only: from port 1->2, 2->3, and 3->1. Waveforms propagating in the reverse direction (e.g. 2->1) are absorbed.

Sample cavity 147—a rectangular waveguide resonator constructed such that the sample is mounted at one of the electric-field maxima of the standing wave within it.

E-plane tee 141—a three port waveguide structure forming a tee with the junction in the broad wall of the rectangular waveguide. Splits microwave power equally between two outputs, which are 180 degrees out of phase with each other.

Differential voltage amplifier 160—amplifies the difference between two input voltages over a broad frequency band (e.g. DC-200 MHz).

Lock-in amplifier 17—amplifies a narrow frequency component of the input voltage, determined by the reference waveform provided.

Dirty box 210—AC voltage input through bulkhead feed-through low-pass filters.

Tunable DC voltage supply 220—used to tune the frequency of the microwave source.

Signal voltage 231—rectified microwave probe amplitude, giving the envelope of the microwave waveform.

Faraday cage 240—an electrically continuous metal enclosure the provides electromagnetic shielding to the contents.

Broadband voltage amplifier 245—amplifies a wide band of frequencies in the input voltage (e.g. 10 kHz-2 GHz).

The present disclosure relates to both steady-state microwave conductivity (SSMC) systems and time-resolved microwave conductivity (TRMC) systems for measuring the photoconductivity of materials, for a variety of materials having photoconductive properties. In some embodiments of the present disclosure, a SSMC system may measure the photoconductivity without the use of a pulsed-laser for photoexcitation of the material, resulting in a single figure of merit by combining the yield, mobility, and lifetime of the photogenerated charges: the steady-state photoconductivity. Thus, in some embodiments of the present disclosure, a SSMC system, as described herein, may enable the easy exploration of new variables, permit the use of ultra-low light intensities, and/or provide more rapid data acquisition. According to some embodiments of the present disclosure, TRMC systems are described.

Materials that may be tested using the systems and methods described herein include any material that exhibits an effective microwave photoconductivity for an arbitrary excitation wavelength, such as semiconducting materials and/or materials having photovoltaic properties. Examples include perovskites, 2D metal dichalcogenides, III-V semiconducting alloys, CdTe alloys, CIGS, and organic semiconductors. The systems and methods described herein provide solutions suitable for both relatively small laboratory batch scale testing of materials and relatively large continuous manufacturing scale testing of materials.

Beginning with SSMC systems, according to some embodiments of the present disclosure, SSMC systems may be configured for batch measurements of the photoconductivity action spectrum of novel materials within a sample cavity (microwave resonator) or configured for continuous measurement, e.g. on a roll-to-roll process, of non-contact white-light photoconductivity measurements of an externally mounted sample (e.g. a coating, film, layer, etc. being manufactured on the roll-to-roll process).

In some embodiments of the present disclosure, a SSMC system may include a homodyne circuit with lock-in detection of the signal and a GHz probe frequency for the purpose of measuring photoconductivity. The sample of the material of interest may be optically excited using an amplitude modulated light source, termed the "pump", at frequency $\omega_1$, thus modulating the material's conductivity through the production (while the light is on) and recombination (while the light is off) of free charge carriers. This change in conductivity alters the microwave absorption coefficient of the material, thus transforming the optical modulation signal into a shallow amplitude modulation of the microwave "probe" waveform, the depth of which is proportional to the change in sample conductivity. In this context, it is understood that "pump" radiation induces photoconductivity in the sample while the "probe" radiation is used to measure it. The amplitude modulation of the microwave probe is extracted using the homodyne circuit. The lock-in amplifier, referenced to the optical modulation frequency ($\omega_1$), filters out noise and interference at all other frequencies. Material samples may be coupled to the system by mounting them inside a microwave resonator (i.e. sample cavity) that is coupled to the homodyne circuit, or by the use of a horn antenna to reflect the microwave probe off of a metal-backed sample of the material being evaluated. When a microwave resonator is used, it is important to select a sufficiently low phase-noise microwave source that the bandwidth of the resonator dip is easily resolved.

If the mixer used in the homodyne circuit is implemented using a magic tee or similar four port device, the output signal may be read either by balancing the two outputs and amplifying the difference between them, or by nulling one output and observing its deviation from zero. These conditions are determined by the choice of phase matching conditions for the signal and local oscillator prior to entering the magic tee. Variations in pump light intensity may be measured and calibrated out by the use of an optical beam splitter and reference detector (e.g. silicon photodiode) upstream of the sample. In the case of differential detection of two balanced signals (e.g. signal channel A and B), a differential amplifier may be used, or if present, the direct differential input of the lock-in amplifier. Amplitude modulation of the microwave probe source at a separate frequency $\omega_2$ ($\omega_2 \neq \omega_1$), which is phase-locked to the optical pump modulation frequency ($\omega_1$), may be used to filter out noise in the homodyne circuit and external path to the amplifiers, in which case lock-in detection of the signal takes place at the sum ($\omega_2+\omega_1$) or difference ($\omega_2-\omega_1$) frequency between the optical and microwave modulations. Acoustic damping pads (e.g. sorbothane™ sheeting) may be used to mount the waveguide circuit, the MW paths, reflected from sample and reference MW, within the homodyne circuit to reduce vibrational noise pickup of the system. A Faraday cage and low-pass power-line filters may be used to reduce electromagnetic noise pickup of the system.

FIG. 1A illustrates a block diagram of an exemplary SSMC system 100, according to some embodiments of the present disclosure. As described herein, this exemplary SSMC system 100 is designed to, among other things, measure the photoconductivity action spectrum of solid-state materials: the amplitude of the steady-state microwave absorption signal as a function of excitation wavelength (color), including any photon energy that elicits a photoconductive response from the hard ultraviolet to the infrared. For example, optical excitation may be provided by a broadband (white) light source 120 (e.g. a 100 watt to 200 watt xenon arc lamp, a supercontinuum laser, light emitting diode etc.), passed through a tunable optical bandpass filter 122 (e.g. a 0.3 m monochromator with 1200 g/mm grating) and modulated (i.e. chopped) using an optical amplitude modulation device (e.g. chopper wheel, liquid crystal shutter, Pockel's cell, etc.) 124. Alternatively, the light may be modulated directly by pulsing the light source, whether it be an arc lamp, laser, LED or other. The light beam 121 should have sufficient intensity to induce measurable photoconductivity in the sample (e.g. between about $10^{10}$ photons/cm$^2$/s/nm and about $10^{16}$ photons/cm$^2$/s/nm) and the filtered light 123 should be sufficiently narrow in bandwidth (e.g. between about 0.1 nm and about 50 nm) to resolve the material properties of interest, whilst being broadly tunable over the spectral region of interest (e.g. wavelengths between about 150 nm and about 2500 nm).

No single combination of light source and bandpass filter need meet these criteria, as subranges of these broad definitions of intensity, bandwidth, and tuneability will be selected for specific samples of interest. For example, a light intensity of $10^{15}$ photons/cm$^2$/s/nm with 5 nm bandwidth and tuning from between about 400 nm and about 900 nm was used to measure the data in FIG. 3E using an exemplary SSMC system. A sinusoidal frequency-reference voltage (e.g. between about 1 Hz and about 100 MHz) 126 that corresponds with the optical modulation frequency is output from the optical modulation device or pulsed light source 124 and connected via a coaxial cable (not shown) to the reference input of the lock-in amplifier 170. The modulated (chopped) optical beam 125A may then be directed through a beam splitter 127, allowing a small fraction of the light (e.g. between about 5% and about 15%) 125B to strike a reference photodiode 128, which provides a reference measurement of light intensity 129 to be used to normalize out fluctuations in the light source intensity. The remainder of the chopped light 125C may be focused on the sample material of interest (not shown), which may be mounted at one electric field maximum of a microwave resonator 147.

Microwaves 111 for probing the sample originate at a microwave source 110 having a tunable output frequency suitable to the selected microwave band and/or microwave resonator (e.g. between about 2 GHz and about 50 GHz). The exemplary SSMC system is constructed in X-band waveguide (e.g. between 8.2 GHz and 12.4 GHz) with a microwave resonator having a TE$_{102}$ mode at between about 9.8 GHz and about 10 GHz. The microwaves produced may be immediately coupled into rectangular waveguide 113 via a waveguide-to-coaxial transition 112. All subsequent components of the homodyne circuit 140 up to the crystal diode detectors (153A and 153B) may be constructed in rectangular waveguides (145, 148, and 151) or coaxial transmission lines. Herein we describe a system implemented in waveguide, as that is the method used in the exemplary SSMC system. An E-plane tee 141 may split the microwaves into two branches: a path to the sample 145 and a reference path 151, each of which pass through an isolator (143A and 143B) immediately after the E-plane tee 141. The path to sample 145 may then be directed to a 90-degree waveguide twist 144, preparing for ultimate mixing of the microwave "signal" waveform reflected from the sample cavity 147 and the "reference" waveform 151 in a magic tee 152 (one example of a mixer), which utilizes orthogonal polarization of the reference waveform 151 relative to the microwave signal waveform 148. A circulator 146 may direct the microwaves exiting the 90-degree waveguide twist 144 to the sample cavity 147 where the microwaves interact with the sample cavity, and a significant fraction (between about 10% and about 80% of the power) of the microwaves may be reflected back to the path to the detectors. This reflected microwave signal encounters the circulator 146 again and is directed through a third isolator 143C to the E-plane port of the magic tee 152. The microwaves in the reference branch 151 may pass through a variable attenuator 149 (e.g. between about zero dB and about 40 dB) and a variable phase-shifter 150 (e.g. between about zero degrees and about 180 degrees) before entering the H-plane port of the magic tee 152.

In some embodiments of the present disclosure, the reference microwave signal entering the H-Plane port of a magic tee 152 may be split 50/50 between its two output ports, with each output signal in-phase with the other. The reflected microwave signal from the sample entering the E-plane port of a magic tee may also be split 50/50 between the two output channels, but with the two outgoing signals 180-degrees out of phase with each other. Thus, if the relative phase and amplitude of the microwave signals in the reference and sample branches are equal (154A and 155A, respectively), complete constructive interference will occur in one output port, and complete destructive interference will occur in the other: the power of the two branches will be summed at one port and subtracted at the other. If the relative phase of the sample and reference branches is instead set to 90-degrees, then equal power appears at each output port of the magic tee (154A and 155A). The exemplary SSMC system and method are operated in this latter situation. The crystal diode detectors (153A and 153B) may be subjected to equal microwave power when no excitation is applied to the sample. When photoexcitation is applied to the sample it may cause the power reflected from the sample/cavity system to change, which un-balances the two detector signals (154B and 155B). The difference between them may be amplified using a differential amplifier 160, the output of which is sent to the lock-in amplifier 170. The lock-in amplifier multiplies the reference signal from the optical chopper 126 by the difference signal 162 and applies an aggressive low-pass filter (internal to the lock-in amplifier). Any component of the difference signal 162 that is matched in frequency and phase to the frequency reference signal 126 appears as a DC voltage at the output, the frequency-filtered amplified difference signal 172, which is the root-mean-squared amplitude of the signal of interest.

Figure 1B:
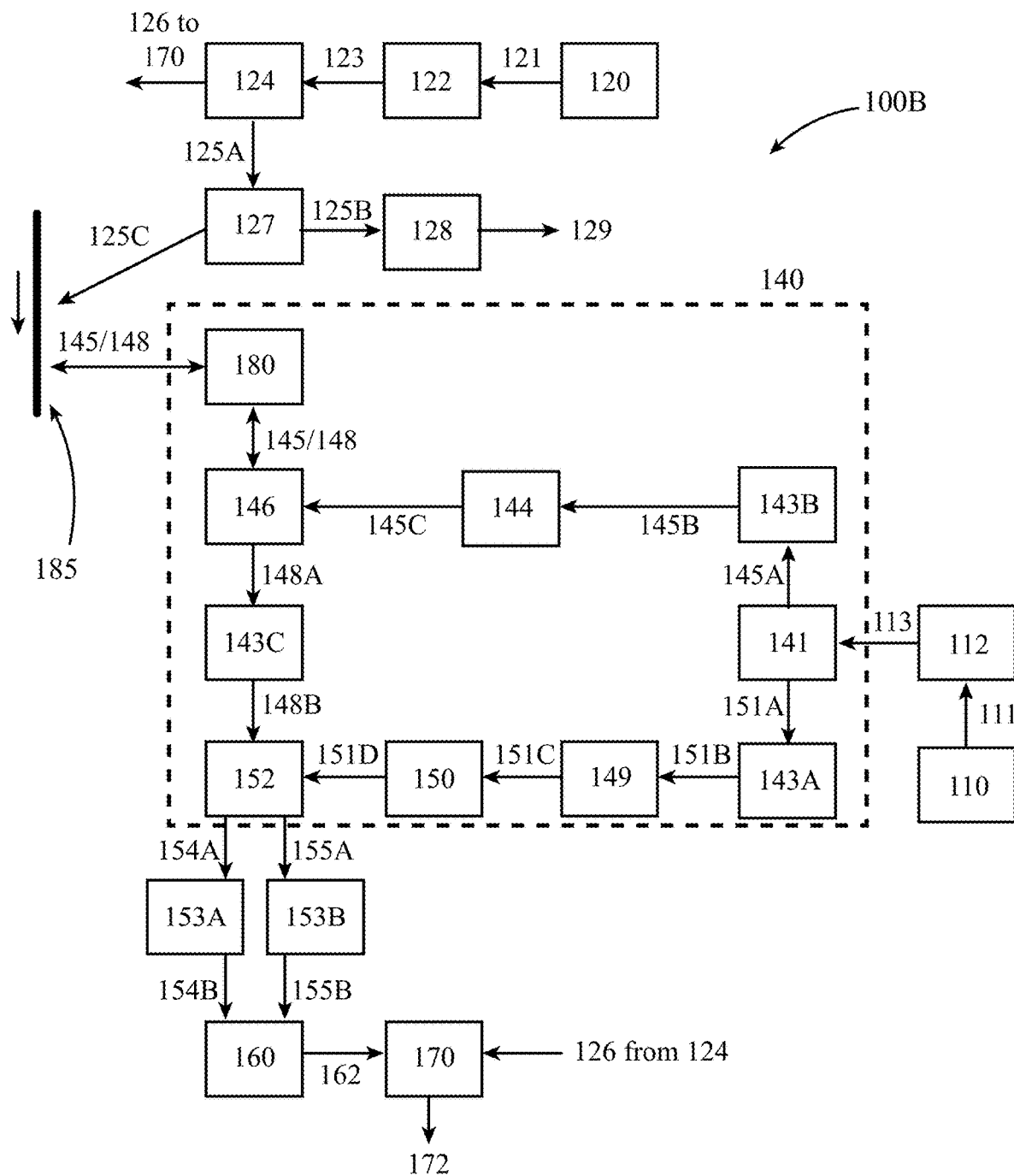
FIG. 1B illustrates a block diagram of an exemplary SSMC system suitable for continuous sampling, according to some embodiments of the present disclosure.
Figure 1C:
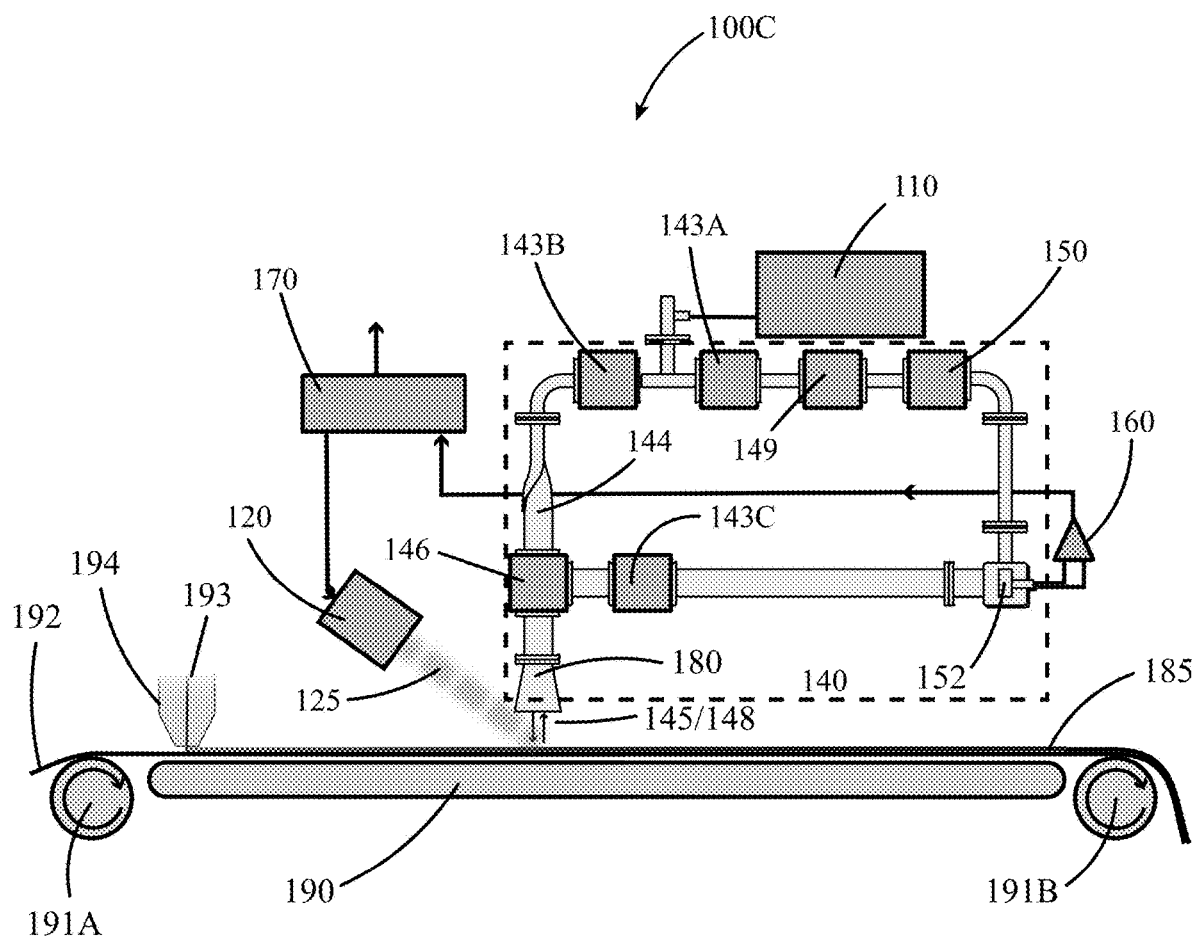
FIG. 1C illustrates a block diagram of an exemplary continuous roll-to-roll SSMC system, according to some embodiments of the present disclosure.

FIG. 1B illustrates a block diagram of an exemplary SSMC system 100B, according to some embodiments of the present disclosure. This system 100B is similar to the system 100A illustrated in FIG. 1A, modified for a continuous roll-to-roll manufacturing system. One difference between the two systems is that the microwave resonator 147 which had housed the sample is replaced by an antenna 180 that couples microwave power to free space. This free-space probe interacts with a large external sample, for example a film 185, and is reflected back into the transmitting antenna 180 by a conductive back-contact (not shown), having a thickness greater than the skin depth of the conductor at the microwave probe frequency, for example greater than between about 100 nm and about 200 nm at X-band. The remainder of the system 100B and its operation is similar to the description provided above for the system 100A of FIG. 1A. FIG. 1C illustrates a cartoon of a SSMC system 100C configured to continuously measure the photoconductivity of a film 185 produced in a continuous roll-to-roll process. A substrate 192 is provided to the SSMC system 100C and transported on a conveyor 190 between two rollers (191A and 191B). (Any suitable substrate may be used, as the conductive back contact prevents microwave interaction with it.) Ink 193 is supplied to a coating head 194, which applies the ink 193 onto the substrate 192. The remaining elements in FIG. 1C are described above for FIGS. 1A and 1B. FIG. 1C illustrates the physical relationships of the various elements, more realistically portrayed for an actual system utilized to collect the experimental data presented herein.

Thus, in some embodiments of the present disclosure, a steady-state microwave conductivity (SSMC) system including a homodyne circuit may be used to measure the steady-state photoconductance induced in a photoconductive sample by a modulated light source, where a lock-in amplifier is used to discriminate signal from noise. The sample may be a thin-film or wafer mounted on a metal electrode surface, or a sample of any form that is mounted inside a well-defined waveguide cell.

In some embodiments of the present disclosure, the homodyne circuit may be a built in X-band waveguide, operating between about 8.2 GHz and about 12.4 GHz. A low phase-noise microwave source may provide about 100 mW of microwave power, which may be split between the reference arm and the measurement arm. The microwave power traveling down the measurement arm passes through an isolator and a circulator and is reflected from the material contained in the sample cavity. The reflected microwave signal then re-enters the circulator and is directed through another isolator into the E-plane port of a magic tee. The microwave power traveling down the reference arm passes through an isolator, a variable attenuator, and a phase shifter before entering the H-plane port of the same magic tee. The collinear ports of the tee may then be terminated by identical tunable detector mounts, equipped with matched crystal detector diodes. The output of each crystal diode may be terminated into 50 ohms, and fed into a fast differential amplifier, whose output may be connected to a lock-in amplifier.

This detection circuit may be tuned by matching the microwave power levels in both arms and setting their relative phase to 90-degrees apart, such that equal power is delivered to both detectors. Any microwave absorption or phase-shift induced by photoexcitation of the material sample un-balances the power at each detector, and the difference is amplified by the differential amplifier. The lock-in amplifier filters and amplifies the output of the differential amplifier to provide only that signal which is matched in frequency and phase with the reference waveform provided by/to the modulated light source that photoexcites the sample. Alternatively, the differential input of the lock-in amplifier (if extant) may be used directly, without a separate differential amplifier. Two sample configurations and light sources have been realized. The sample configurations are:

1. A sample of the photoconductive material of interest is mounted on a dielectric substrate and enclosed in a resonant waveguide sample cavity with optimized sensitivity: Q-factor on the order of 1000. This cavity is bolted to the circulator in the measurement arm of the homodyne circuit, and the microwave frequency is set to be on-resonance with the characteristic frequency of the cavity's $TE_{102}$ mode (see FIG. 1A).
2. A sample of the photoconductive material is mounted on a highly conductive electrode and placed ~0.1-1.5 cm away from a 15-25 dB horn antenna, such that the majority of the incident microwave power is reflected from the electrode back into the antenna. Any microwave frequency within the bandwidth of the waveguide and the magic tee junction may be used (FIGS. 1B and 1C).

The first sample configuration allows batch measurements of small samples that have relatively weak photoconductance. The second configuration allows rapid measurement of large samples with relatively strong photoconductance signals and is intended for, among other things, use as an in-line characterization tool for roll-to-roll production of next-generation solar cell materials.

The two different light sources have been tested: A white LED that can be electrically modulated up to 50 kHz, and a xenon arc-lamp equipped with a monochromator and a mechanical chopper, providing square-wave modulation up to a few hundred hertz. Either light source may be used in combination with each sample configuration. The white LED provides access to higher modulation frequencies which are useful for characterizing the lifetime of the photoconductivity signal, and the broad optical spectrum provides a rough simulation of solar illumination for PV efficiency screening. The xenon lamp provides the ability to tune the excitation wavelength, thus producing a steady-state photoconductance action spectrum.

In research settings there is a need for a rapid non-contact method of measuring the photoconductance action spectrum of novel materials. In production and PV process development research there is a parallel need for rapid non-contact methods of measuring white-light photoconductivity as a proxy for power conversion efficiency. The systems and methods presented herein, including the combination of a homodyne receiver with a lock-in amplifier and square-wave modulated excitation provides superior sensitivity, has the potential to be cheaper and more compact, and provides the user with a simpler, more complete, metric (steady-state photoconductance) of material performance. Further details of an exemplary SSMC system capable of providing such advantages and benefits are provided below.

SSMC System Details

This exemplary SSMC system was optimized specifically for high sensitivity detection of steady-state signals produced by square-wave excitation of the sample. A high-quality factor microwave resonator (Q=850) was used to amplify the signal, a low phase-noise microwave source (Rohde & Schwartz SMF 100A) to match the narrow bandwidth of the cavity, a homodyne detection circuit to cancel amplitude noise, and a lock-in amplifier (Stanford Research, SR830) to acquire the photo-modulated signal.

Referring again to FIG. 1A, which shows a diagram of the microwave homodyne circuit. The microwave probe is split into two arms, reference and sample. The sample arm contains the sample cavity, coupled to the circuit via a circulator; the reference arm contains a variable phase shifter and attenuator. The two arms rejoin at a magic tee, which has a pair of matched Schottky barrier diode detectors (1N23C), one in each output arm of the tee. The whole circuit is implemented in WR90 (X-band) waveguide, and the isolators and circulator (M-Wave Design) all have a directivity of ≥35 dB.

In operation, the microwave frequency (~9.9 GHz, 100 mW, R&S SMF100A) was tuned to resonance with the sample cavity, the amplitude in each arm was equalized, and the relative phase was set to 90°. Interference of the reference and sample signals in the magic tee produced equal output power at the two detectors; any change in sample conductivity due to optical excitation manifested as an imbalance of the two detector signals, which was acquired and selectively amplified using a differential voltage amplifier and a lock-in.

For spectroscopic experiments, excitation was provided by a 150 W xenon arc lamp coupled to a monochromator (OBB Tunable Power Arc, 0.3 m f/4 monochromator, 1200 lp/mm grating). The output beam was mechanically chopped (SR540) and sampled using a fused silica beam-splitter and an amplified photodiode to provide an excitation reference channel. The remaining output was columnated by a 45° off-axis parabolic mirror (OAP, f/4, 50 mm dia.) and reimaged onto an opening in the sample cavity by a second OAP (f/2). The latter optical relay configuration allowed the microwave circuit to be placed as far as possible from the optical chopper while also maximizing optical coupling efficiency. The former consideration is important, as one of the main noise sources in the present instrument configuration is vibrational coupling with the optical chopper wheel used to modulate the arc lamp.

The raw data output from this instrument was the root-mean-square voltage ($V_{RMS}$) difference between the two detectors (terminated into 50 ohms) at the reference optical modulation frequency. The optical modulation and the data were both well described as square-waves, from which the lock-in extracts the first component of the Fourier expansion describing it, which has an amplitude coefficient of $2/\pi$. From these considerations it follows that the peak-to-peak voltage modulation ($V_{PP}$) is:

$$\Delta V_{PP} = \pi \frac{\sqrt{2}}{2} \Delta V_{RMS}$$

In addition, the use of difference detection in the balanced interferometer produces a gain factor of 2, as a reduction in power reflected from the sample cavity due to microwave absorption in the sample appears at both detectors with opposite sign. Thus, the voltage change ($\Delta V_S$) that characterizes the response of the microwave cavity to photoconductivity in the sample is:

$$\Delta V_s = \pi \frac{\sqrt{2}}{4} \Delta V_{RMS}$$

The change in microwave power reflection ($\Delta R$) is calculated according to:

$$\Delta R = \frac{\Delta P}{P} = n(V_{Cell}) \frac{\Delta V_S}{V_{Cell}}$$

where $n(V_{Cell})$ is an empirical calibration function that describes the sensitivity of the detector, and $V_{Cell}$ is the equilibrium voltage output of the two detectors when the microwave frequency is on resonance with the cavity, and the homodyne is balanced. $\Delta P$ is the change in microwave power reflected from the sample and/or cavity upon photo-excitation, and P is the microwave power reflected from the sample and/or cavity at equilibrium. The photoconductance ($\Delta G$) is calculated as:

$$\Delta G = -\frac{1}{K} \frac{\Delta P}{P}$$

Where K is the sensitivity factor of the microwave cavity, calculated form electromagnetic simulations.

The final transformation we perform is to divide the photoconductance by the photon flux at each excitation wavelength, which is calculated from the reference diode measurement and a calibration measurement using a NIST-traceable silicon photodiode (Newport 818-UV/DB) mounted at the sample position.

SSMC System Example 1

Figure 1D:
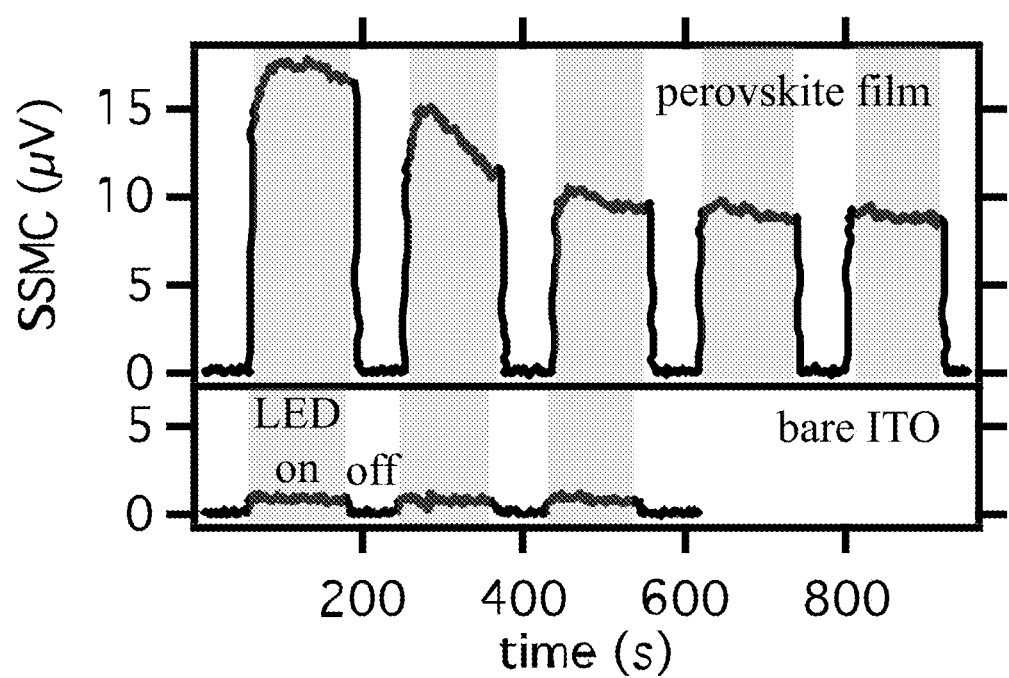
FIG. 1D illustrates experimental photoconductivity data collected for a perovskite film, using a SSMC system, according to some embodiments of the present disclosure.

FIG. 1D illustrates the potential for using the exemplary SSMC system disclosed herein for monitoring the performance of an externally mounted sample via a microwave coupling antenna. In the present example a methyl ammonium lead iodide (MAPbI$_3$) film was deposited on a large (between about 2 inch to 3 inch square) indium tin oxide (ITO) coated glass substrate, and placed 0.5 cm away from a 20 dB horn antenna. The sample was photoexcited from the back side using an electrically modulated white light LED, with a modulation frequency of 1 kHz. The upper panel shows the response of the MAPbI$_3$ film; the lower panel shows a control experiment using bare ITO, which also exhibits weak photoconductivity. The modulated pump light was periodically blocked from reaching the sample to show the response of the system to illumination (grey shading). The steady decline in the photoconductivity signal over hundreds of seconds is due to environmental degradation of the MAPbI$_3$ film. Although the sample was stationary in this example, it illustrates the potential for using this system to measuring a moving roll, as well as the feasibility of measuring photoconductance from photovoltaic materials that are deposited on a highly conductive substrate.

SSMC System Example 2

Figure 1E:
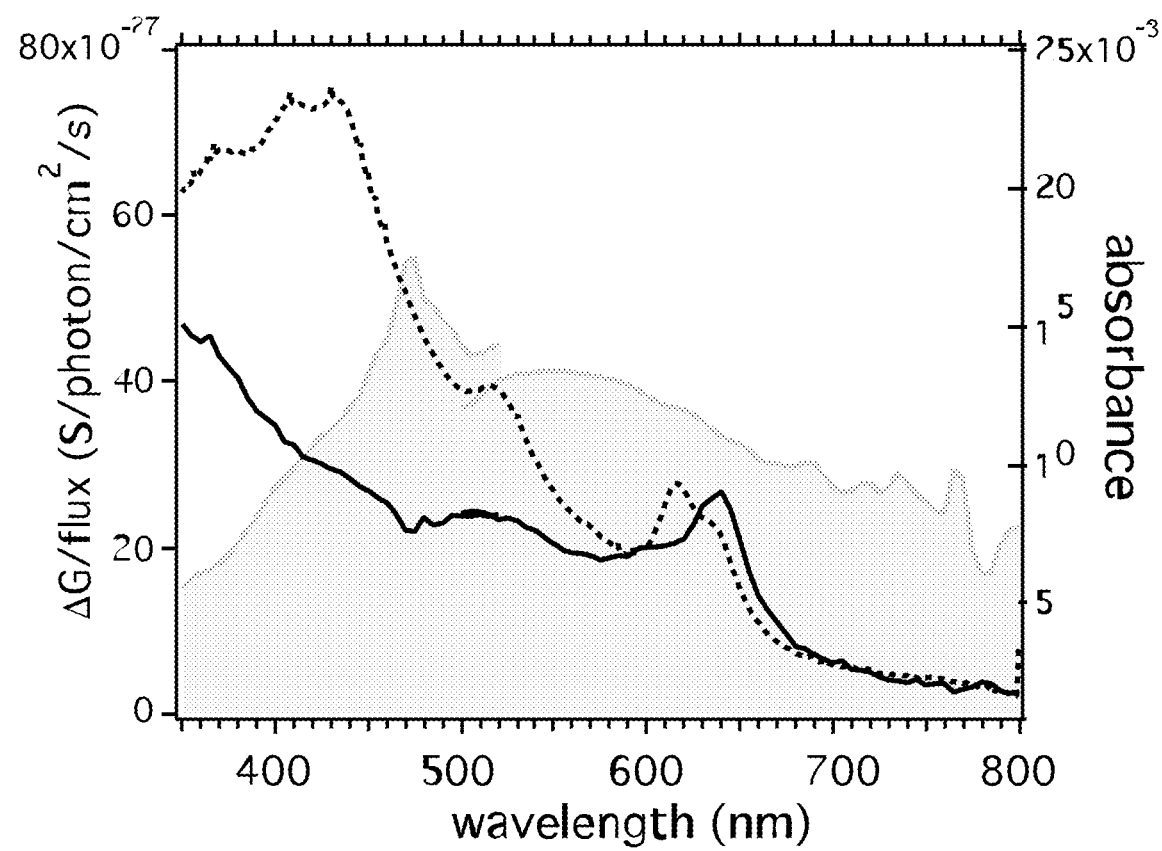
FIG. 1E illustrates an example using an SSMC system to measure a sub-monolayer dispersion of tungsten disulfide flakes spread out on a quartz substrate, according to some embodiments of the present disclosure.

FIG. 1E shows an example using the SSMC system disclosed herein to measure a sub-monolayer dispersion of tungsten disulfide flakes spread out on a quartz substrate. The left axis (solid trace) shows the steady-state photoconductance per incident photon. The right axis (dashed trace) shows the absorbance of the film. The shaded inset shows the flux distribution of the exciting lamp spectrum (axis not shown)

Figure 2A:
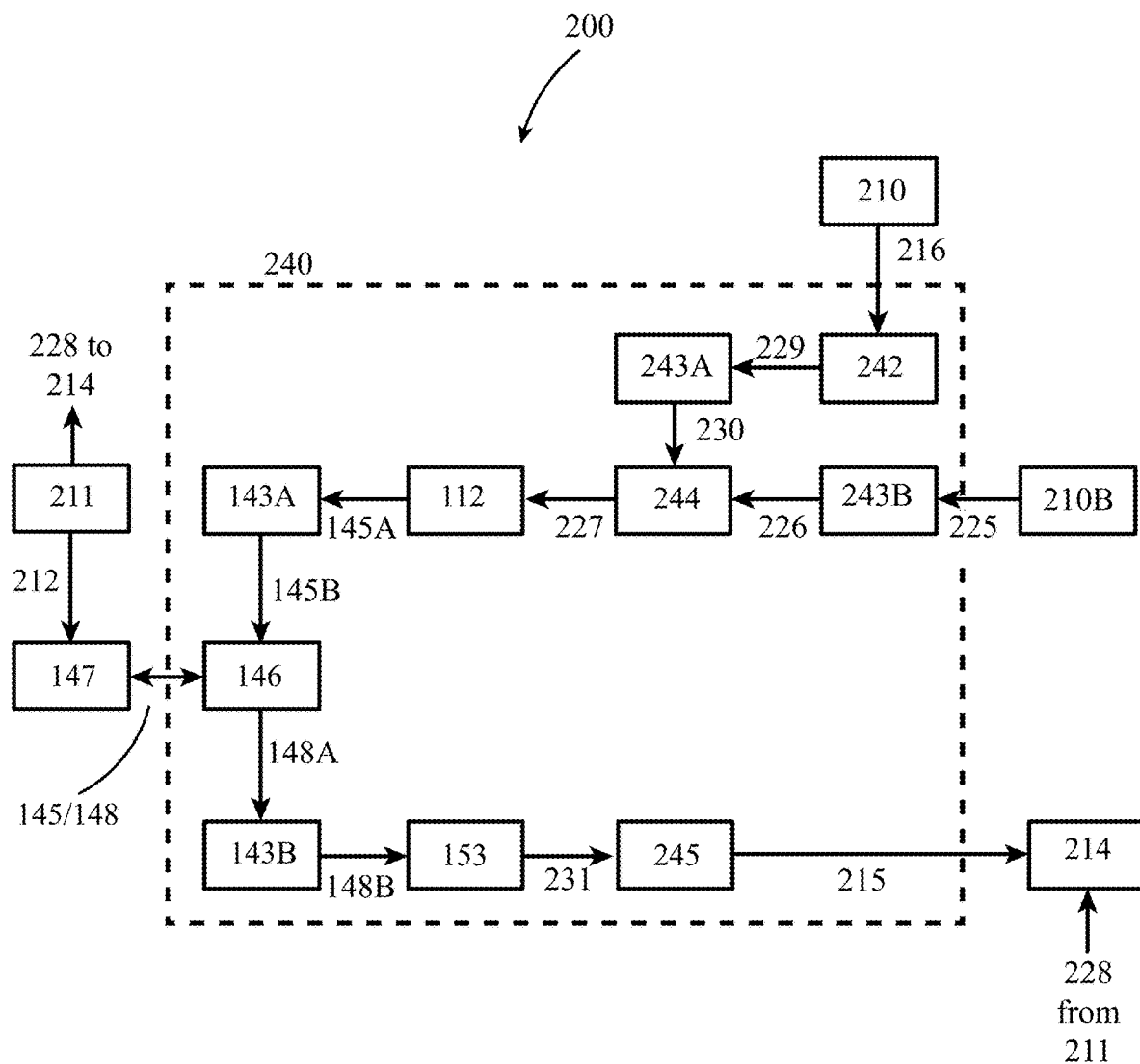
FIG. 2A illustrates a block diagram of an exemplary time-resolved microwave conductivity (TRMC) system, according to some embodiments of the present disclosure.

FIG. 2A illustrates a block diagram of a time-resolved microwave conductivity (TRMC) system 200, whereby a portion of the elements and microwave circuit are enclosed within a Faraday 240 cage to mitigate electromagnetic (EM) noise. A dirty box 210 is used to supply filtered AC line power 216 to the system. The microwave circuit includes an AC/DC converter 242 that feeds DC power 229 to a microwave source 244 (e.g. a voltage controlled oscillator), which produces the microwave signal that is directed in a path to the sample 145 at a frequency according to the voltage applied to the microwave source 244. In-line low-pass EM filters 243 are used to minimize interference on the DC voltage input by providing filtered DC power 230 to the microwave source 244. Low-pass EM filters 243 are also used to on the DC tuning voltage 225 from the tunable voltage supply 220, supplying a filtered DC tuning voltage 226 to 244 to minimize fluctuations in microwave frequency and amplitude. The microwave signal exiting the microwave source 244 is contained in coaxial cable 227 and is transitioned to an X-band waveguide in waveguide-to-coaxial transition 112, where the microwaves pass through an isolator 143A before entering a circulator 146 with branches to the sample cavity 147 through path 145 and to detector 153 through path 148.

The sample-attenuated microwave signal passing through path 148B downstream of the sample cavity 147 passes through another isolator 143B and then is converted to a signal voltage 231 by a crystal diode detector 153. The signal voltage 231 is amplified by a broadband voltage amplifier 245 and the amplified signal voltage 215 is displayed on an oscilloscope 214. The oscilloscope 214 is triggered to measure 215 in sync with the trigger voltage 228 from the pulsed coherent light source 211 used to excite the sample within the sample cavity 147.

Figure 2B:
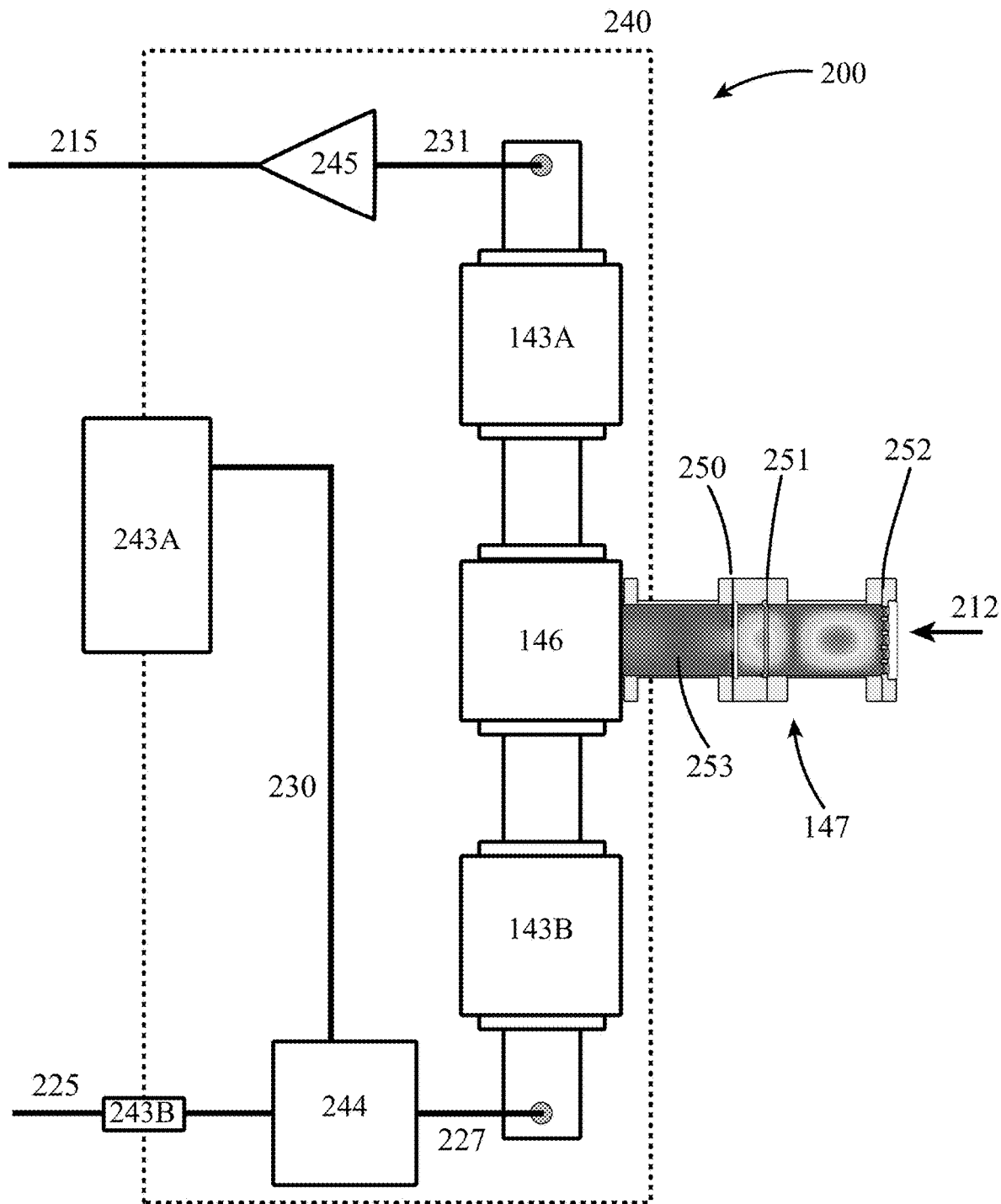
FIG. 2B illustrates a block diagram of an exemplary TRMC system, according to some embodiments of the present disclosure.

FIG. 2B shows a version of FIG. 2A with some omissions for simplicity. More detail about the sample cavity 147 is shown in FIG. 2B. Pulsed light 212 enters the cavity through a microwave grid reflector and quartz window 252, where it interacts with the thin-film sample 251 positioned at the electric field maximum of the microwave in the cavity 147. An iris and window 250 is used to jointly set the quality factor and input impedance of the cavity 147. The sample's photoconductivity is proportional to the change in microwave power reflection as detailed in the equations above.

Photovoltaic materials may be evaluated/screened for performance by photoconductivity measurements. Time resolved microwave conductivity (TRMC) is one method of measuring photoconductivity, which outputs three useful figures of merit: (i) internal quantum efficiency of photoinduced charge generation multiplied by (ii) the sum of free-to-move charge carrier mobilities, and (iii) the lifetime of those mobile charges on a device relevant timescale, nanoseconds to microseconds, which is extracted from the transient portion of the data. Refer to the above equations and TRMC schematic diagrams to extract ΔG from the measurement. The amplitude weighted average time constant, $\tau_{avg}$, is extracted from the transient ΔG data collected at the minimum incident fluence achievable with the system—samples with higher photoconductivity signals will inherent allow for lower excitation fluences. While TRMC gives one the ability to probe sample photoconductivity and $\tau_{avg}$, TRMC alone cannot distinguish in a single measurement the photoconductivity response of the sample over its entire absorption spectrum. A requirement for a high performance PV material is not only that it absorbs over a broad overlap with the solar irradiance spectrum, but that at each wavelength the photons absorbed are converted in free carriers at a maximum internal quantum yield.

For a high-performance material (within a particular class—e.g. perovskites, OPVs, CIGS, quantum dots, etc.), it is desirable to maximize three figures of merit from the TRMC measurement (within the limits of the material class), as well as the solar absorption overlap gleaned from a separate measurement (e.g. UV-vis-IR). Certain properties of the sample material being tested, whether intrinsic at the atomic or molecular level, or extrinsic at the film preparation level, can impact the TRMC signal. Poor carrier mobility, as well as high recombination rates (poor lifetime), are strong indications of a low performance photovoltaic material. As such, TRMC is an excellent tool for screening the photovoltaic potential of new materials. In addition, TRMC can also be useful in distinguishing material classes (perovskites vs OPVs), and even identifying compositions within a material class (inorganic cation perovskite vs organic cation perovskite), if only basic knowledge of the sample is known. In some embodiments of the present disclosure, a TRMC system and/or method may be further complemented with other spectroscopic methods to acquire, among other things, an absorption spectrum to better evaluate and/or identify the nature of the materials being tested (based on absorption features, band edge, and spectral coverage).

TRMC System Details

Referring to FIG. 2B, in some embodiments of the present disclosure, a material may be tested by a TRMC system/method as follows:
1. A thin film sample 251 of interest may be prepared on or cut down to a substrate size of ~11×25 mm and positioned inside the sample cavity 147 (microwave resonant cavity) at position corresponding to the microwave electric field maximum.

Figure 2C:
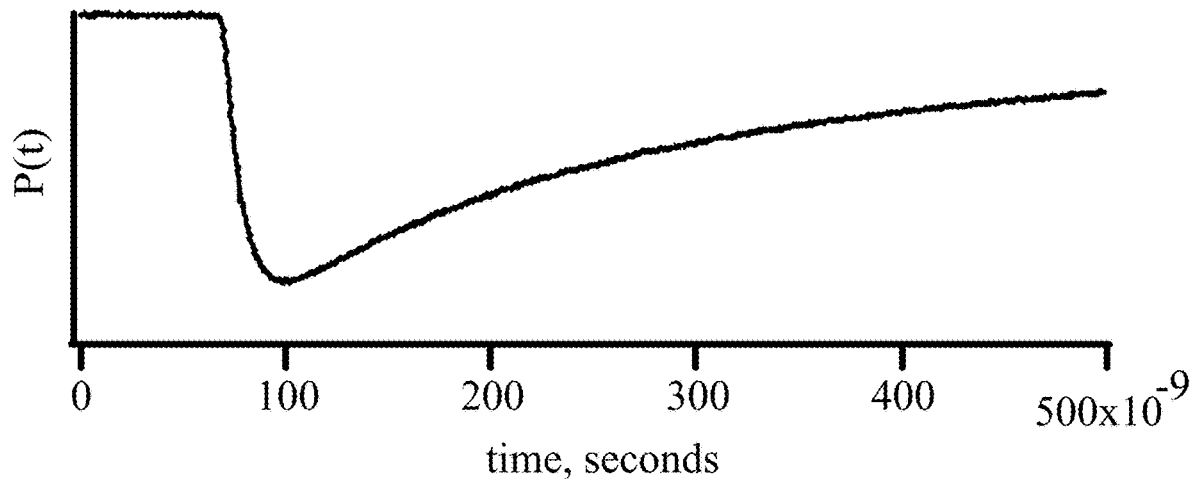
FIG. 2C illustrates figures of merit obtainable from a TRMC system as described herein, according to some embodiments of the present disclosure.
Figure 2C:
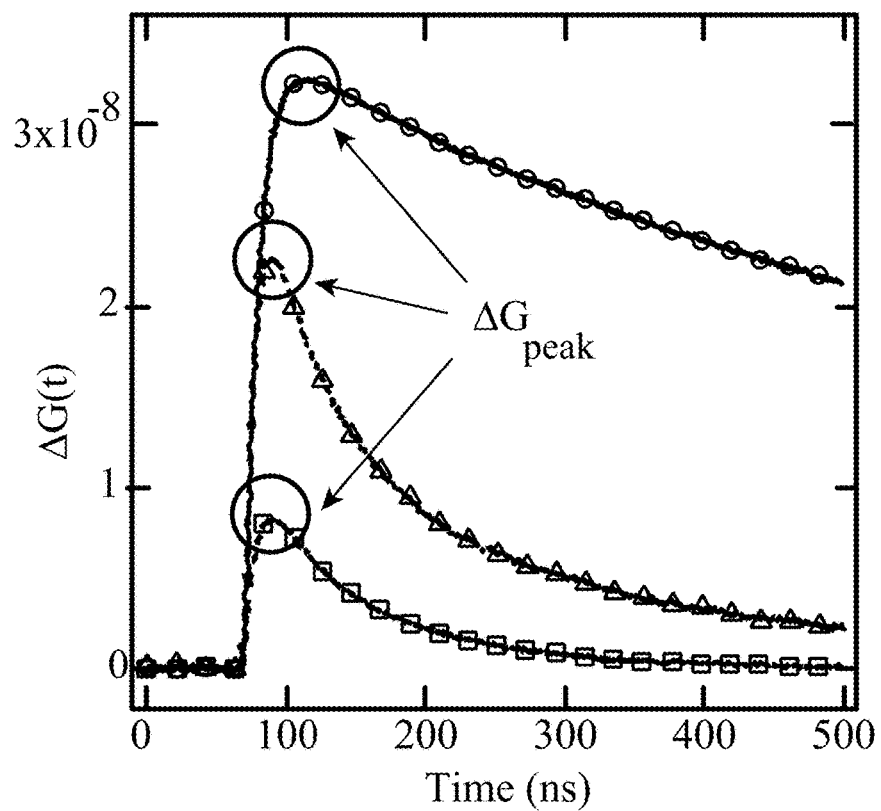

2. A pulsed light 212 (our system uses 5 ns laser pulse) photoexcites the sample 251 through a window 252 that is reflective to microwaves but transmissive to UV-vis-IR.
3. Photoinduced charges in the sample 251 interact with the microwaves, attenuating the microwave power reflected from the cavity 147, which we measure as a change in microwave power, 253.
4. The figures of merit are extracted via Eq. 1-4 (see FIG. 2C); the photoconductivity term contains quantum yield of carrier generation and hole and electron mobilities. Fitting the photoconductivity transient gives the lifetime of mobile charges.

In summary, the three useful figures of merit from the TRMC measurement are yield of charge generation, mobility of charges, and lifetime.

The TRMC data therefore is related to the SSMC data such that for the TRMC data:

$$\Delta G(t) \propto I_0 F_A \phi \Sigma \mu$$

Where $\tau_{avg}$ is extracted by fitting the photoconductivity data recorded at the lowest achievable (or as close to solar intensity as possible) $I_0$, which is the incident sample excitation fluence, $F_A$ is the fraction of photons absorbed, and $\phi\Sigma\mu$ is yield of charge generation multiplied by the sum of free charge carrier mobilities. For the SSMC data:

$$\Delta G_{SS} \propto F_0 F_A \phi \Sigma \mu \tau_{avg}$$

Where $\Delta G_{SS}$ in this case is proportional to the incident excitation photon flux, $F_0$, and also already contains the lifetime component.

Figure 3A:
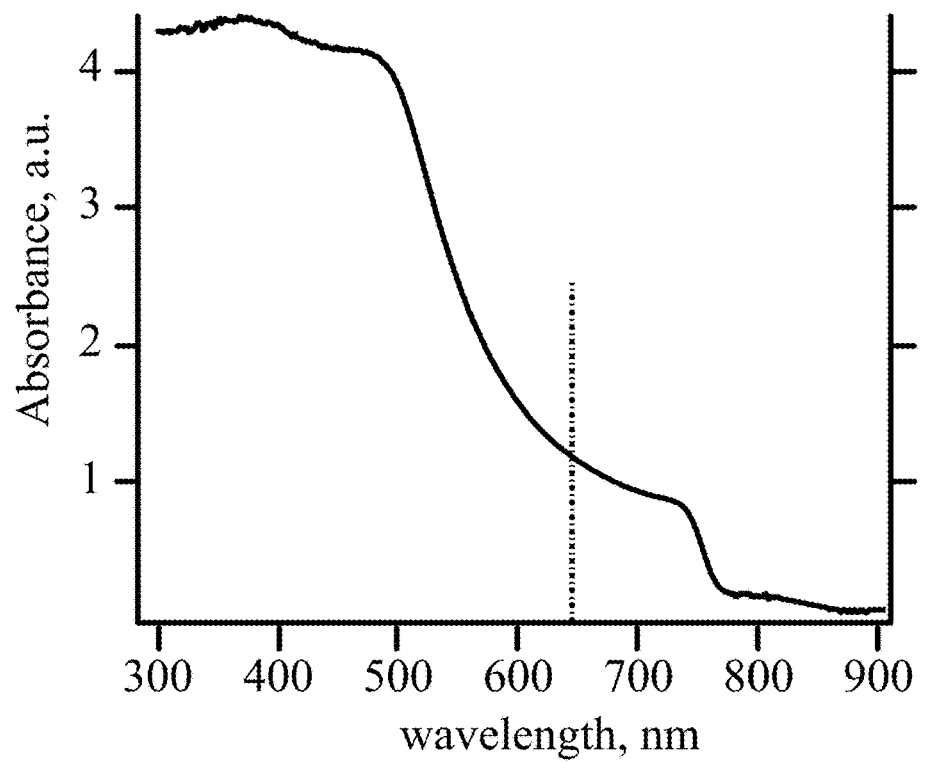
FIG. 3A illustrates an absorbance spectrum and transient photoconductivity data for methylammonium lead iodide, $CH_3NH_3PbI_3$, thin film on quartz, with the latter collected using a TRMC system, according to some embodiments of the present disclosure.
Figure 3A:
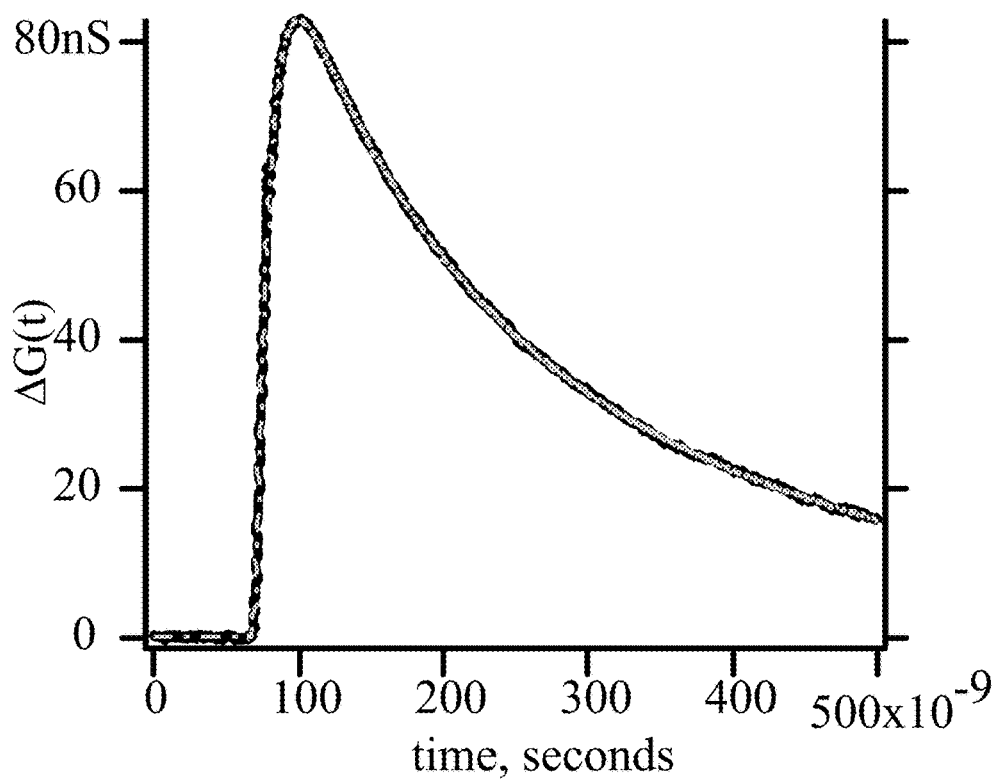

FIG. 3A illustrates an absorbance spectrum for a methylammonium lead iodide, $CH_3NH_3PbI_3$, thin perovskite film, on quartz (top panel). The vertical line indicates the laser excitation wavelength (640 nm) used in the time-resolved microwave conductivity experiment. The bottom panel shows the transient photoconductivity signal (solid line) at an absorbed photon flux of approximately $2\times10^9$ cm$^{-2}$ over half a microsecond timescale. A bi-exponential fit is also illustrated in the bottom panel, by the dashed line. The average weighted lifetime of free charge carriers, tau, is 85 nanoseconds.

Figure 3B:
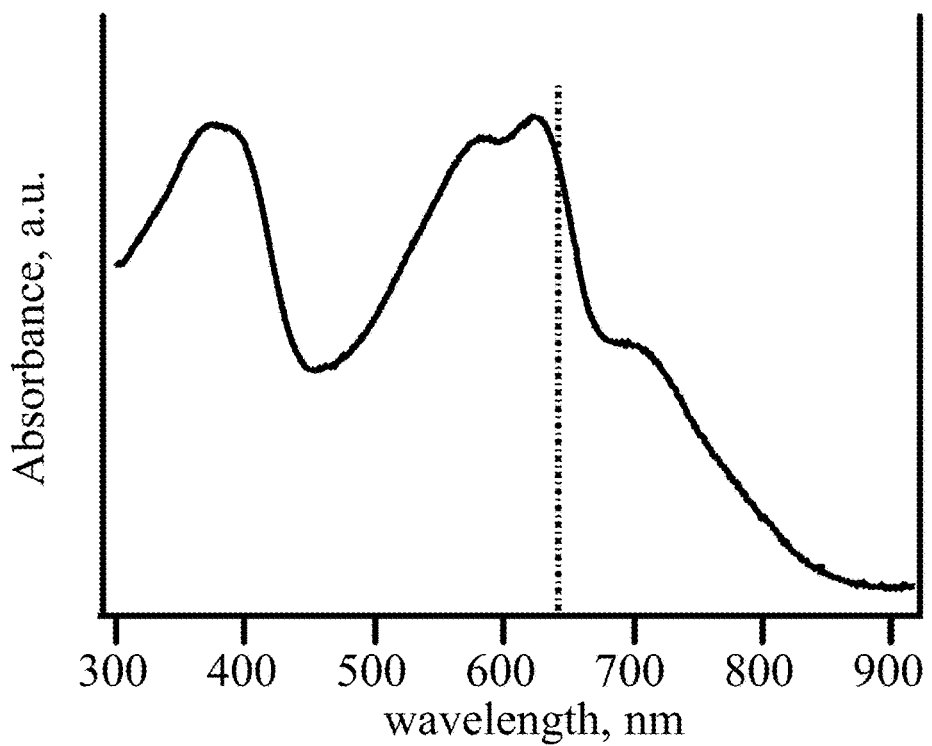
FIG. 3B illustrates an absorbance spectrum and transient photoconductivity data for an organic photovoltaic all-polymer blend thin film on quartz, with the latter collected using a TRMC system, according to some embodiments of the present disclosure.
Figure 3B:
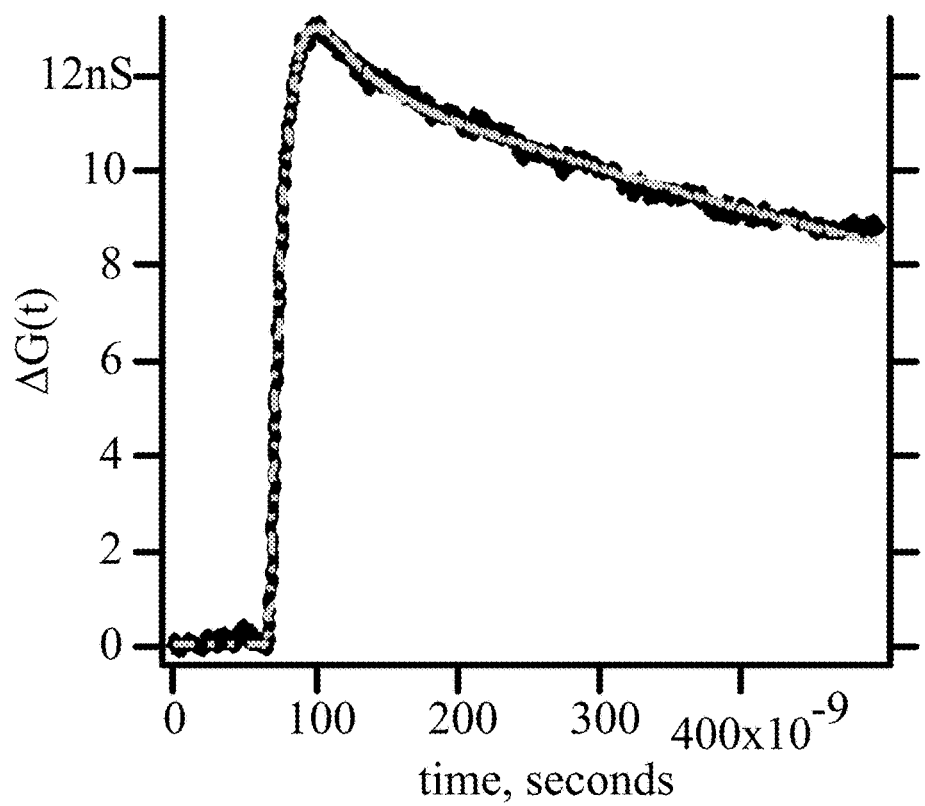

FIG. 3B illustrates an absorbance spectrum for an organic photovoltaic all-polymer blend thin film on quartz (top panel). The vertical line indicates the laser excitation wavelength (640 nm) used in the time-resolved microwave conductivity experiment. The bottom panel shows the transient photoconductivity signal (solid line) at an absorbed photon flux of approximately $1\times10^{11}$ cm$^{-2}$ over half a microsecond timescale. A bi-exponential fit is also illustrated in the bottom panel, by the dashed line. The average weighted lifetime of free charge carriers, tau, is 950 nanoseconds.

Figure 3C:
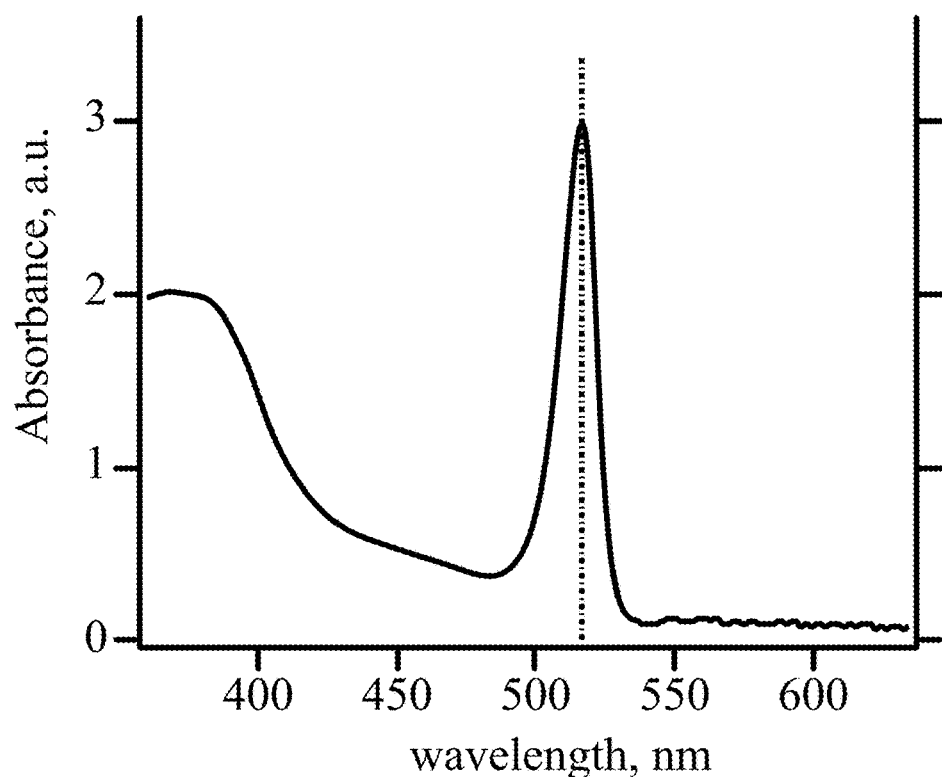
FIG. 3C illustrates an absorbance spectrum and transient photoconductivity data for a two-dimensional (2D) thin film on quartz, with the latter collected using a TRMC system, according to some embodiments of the present disclosure.
Figure 3C:
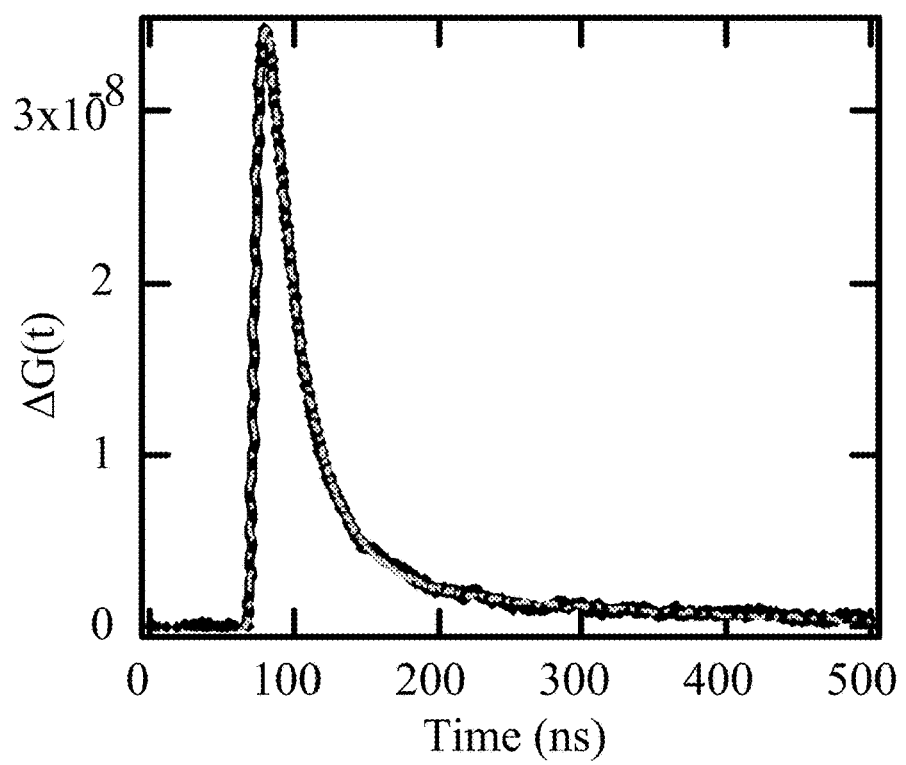

FIG. 3C illustrates an absorbance spectrum for a 2D perovskite thin film on quartz (top panel). The vertical line indicates the laser excitation wavelength (517 nm) used in the time-resolved microwave conductivity experiment. The bottom panel shows the transient photoconductivity signal (solid line) at an absorbed photon flux of approximately $3\times10^{10}$ cm$^{-2}$ over half a microsecond timescale. A bi-exponential fit is also illustrated in the bottom panel, by the dashed line. The average weighted lifetime of free charge carriers, tau, is 17 nanoseconds.

Figure 3D:
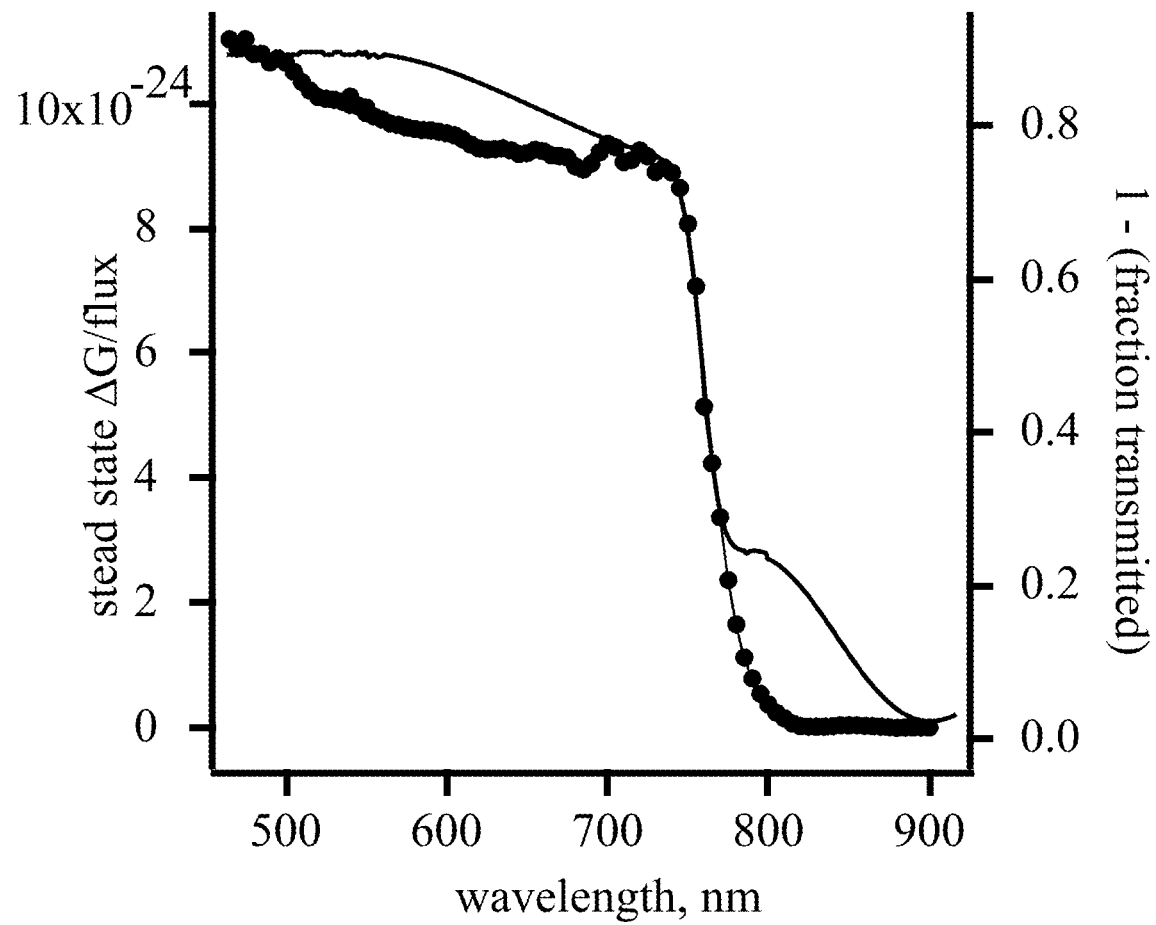
FIG. 3D illustrates SSMC photoconductivity data for the same methylammonium lead iodide perovskite of FIG. 3A, according to some embodiments of the present disclosure. The SSMC data are over-layed with the fraction of light absorbed TRMC data of FIG. 3A.

FIG. 3D illustrates SSMC data is shown (solid line with circles, left axis) over-layed with the fraction of absorbed light (solid line, right axis) for the same perovskite ($CH_3NH_3PbI_3$) thin film sample illustrated in FIG. 3A by TRMC. The SSMC data confirms the absorption feature around 820 nm is a thin-film optical artifact, and the SSMC response tracks precisely with the true band edge of the perovskite.

Figure 3E:
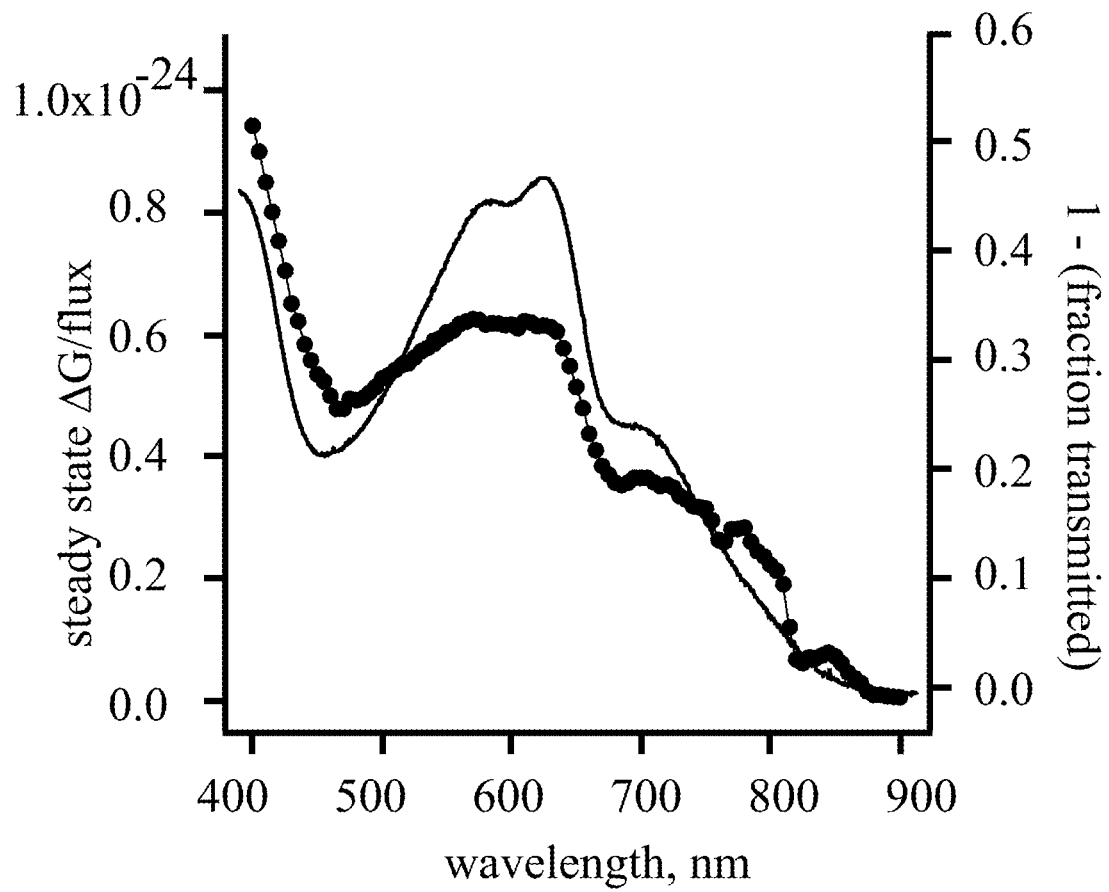
FIG. 3E illustrates SSMC photoconductivity data for the same organic photovoltaic all-polymer blend of FIG. 3B, according to some embodiments of the present disclosure. The SSMC data are over-layed with the fraction of light absorbed TRMC data of FIG. 3B.

FIG. 3E illustrates SSMC data is shown (solid line with squares, left axis) over-layed with the fraction of absorbed light (solid line, right axis) for the same OPV thin film sample illustrated in FIG. 3B by TRMC. The SSMC data tracks the absorption features of the sample especially well for the features that are not optically opaque.

Figure 3F:
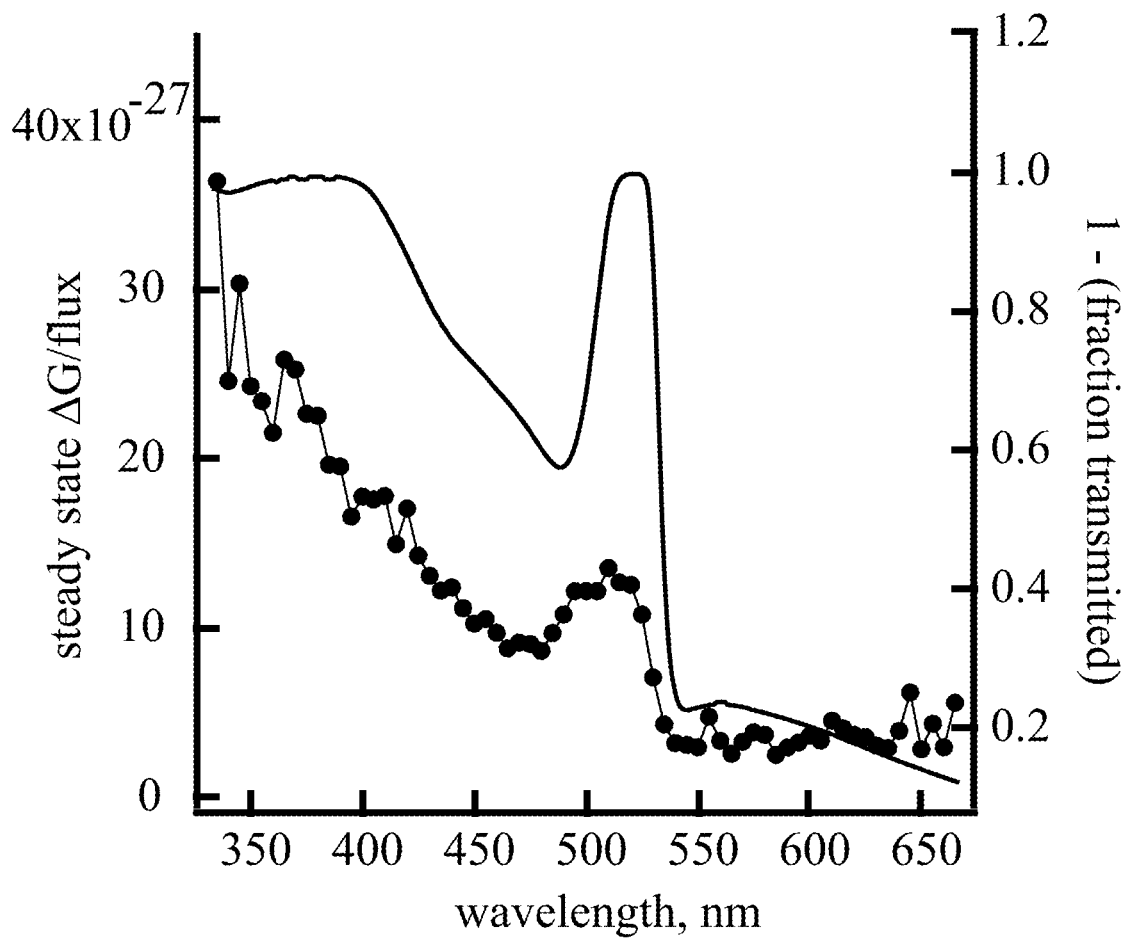
FIG. 3F illustrates SSMC photoconductivity data for the same 2D perovskite of FIG. 3C, according to some embodiments of the present disclosure. The SSMC data are over-layed with the fraction of light absorbed TRMC data of FIG. 3C.

FIG. 3F illustrates SSMC data is shown (solid line with circles, left axis) over-layed with the fraction of absorbed light (solid line, right axis) for the same 2D perovskite ($PEA_2PbI_4$) thin film sample depicted in FIG. 3C by TRMC. The SSMC data tracks the absorption features of the sample and shows that unlike the three-dimensional (3D) perovskite (see FIG. 3A), the SSMC signal is not flat across all wavelengths when the fraction of absorbed light is about one.

Taken together FIGS. 2A-C and 3A-F illustrate how these two techniques (SSMC and TRMC) can be used to distinguish different types of photoconductive materials. As discussed above, TRMC and SSMC provide closely related measurements of four figures of merit for a solar cell material: the yield of charges upon photoexcitation, the mobility of those charges, the charge lifetime, and the spectrum of photons converted to charges. TRMC provides independent measures of (1) the product of yield and mobility, and (2) the charge carrier lifetime. SSMC provides a single measurement that is proportional to the product of yield, mobility and average lifetime, which can additionally be used to explore the spectrum of photons converted to charges; alternatively, white light excitation may be used to fold all four figures of merit into a single number: the steady state photoconductivity under solar illumination as illustrated in FIGS. 1B through 1D. Each material exhibits a unique combination of yield-mobility product, lifetime, and photoconductance action spectrum that may be regarded as a "fingerprint" of that material formulation.

Thus, among other things, the utility of the systems and methods disclosed herein falls into two areas: (1) finger printing material formulations and providing detailed photophysical characterization thereof as in FIGS. 2A-C and 3A-F, and (2) rapid screening of photoconductive materials on both the lab and manufacturing scale, particularly for optimization of photovoltaic conversion properties as in FIG. 1B-D. In the former area (1) TRMC and SSMC are complimentary techniques: TRMC can provide detailed kinetic data on charge lifetime and peak yield-mobility product, while SSMC excels at measurements of spectrum of photons converted to charges. In the latter area (2) SSMC can provide much more rapid feedback to materials researchers or process control engineers, as the product of charge carrier yield, mobility, lifetime, and action spectrum can qualitatively predict the maximum performance potential of a photovoltaic material.

Example Set 1

Example 1. A steady-state microwave conductivity system comprising: a light source; a microwave source; at least one of a microwave resonator or an antenna; a homodyne circuit comprising a mixer; a differential voltage amplifier; and a lock-in amplifier.

Example 2. The steady-state microwave conductivity system of Example 1, wherein the light source comprises at least one of a xenon arc lamp, a supercontinuum laser, or a light emitting diode.

Example 3. The steady-state microwave conductivity system of either Examples 1 or 2, further comprising a tunable filter, wherein the tunable filter is positioned between the light source and the homodyne circuit.

Example 4. The steady-state microwave conductivity system of any one of Examples 1-3, wherein the tunable filter comprises a monochromater having a 1200 g/mm grating.

Example 5. The steady-state microwave conductivity system of any one of Examples 1-4, further comprising a chopper, wherein the chopper is positioned between the tunable filter and the homodyne circuit.

Example 6. The steady-state microwave conductivity system of any one of Examples 1-5, wherein the chopper comprises at least one of a chopper wheel, a liquid crystal shutter, or a Pockel's cell.

Example 7. The steady-state microwave conductivity system of any one of Examples 1-6, wherein the homodyne circuit further comprises a rectangular waveguide.

Example 8. The steady-state microwave conductivity system of any one of Examples 1-7, wherein the homodyne circuit further comprises a coaxial cable.

Example 9. The steady-state microwave conductivity system of any one of Examples 1-8, wherein the microwave resonator comprises a $TE_{102}$ mode between about 9.8 GHz and 10.0 GHz.

Example 10. The steady-state microwave conductivity system of any one of Examples 1-9, wherein the mixer is a magic tee.

Example 11. The steady-state microwave conductivity system of any one of Examples 1-10, further comprising: a beam splitter; and a reference photodiode, wherein: the beam splitter is positioned between the chopper and the homodyne circuit.

Example 12. The steady-state microwave conductivity system of any one of Examples 1-11, wherein: the homodyne circuit further comprises: an E-plane tee; a first isolator; and a second isolator, wherein: the E-plane tee is positioned between the first isolator and the second isolator, and the second isolator is positioned between the mixer and the E-plane tee.

Example 13. The steady-state microwave conductivity system of any one of Examples 1-12, wherein: the homodyne circuit further comprises: a 90-degree waveguide twist; and a circulator, wherein: the 90-degree waveguide twist is positioned between the circulator and the first isolator.

Example 14. The steady-state microwave conductivity system of any one of Examples 1-13, wherein: the homodyne circuit further comprises a third isolator, and the third isolator is positioned between the mixer and the circulator.

Example 15. The steady-state microwave conductivity system of any one of Examples 1-14, wherein: the mixer further comprises: a first crystal diode detector; and a second crystal diode detector.

Example Set 2

Example 1. A steady-state microwave conductivity system comprising: a light source configured to produce an amplitude modulated light having a modulation frequency $\omega_1$; a microwave source configured to produce a microwave waveform; at least one of a microwave resonator or an antenna configured to expose a sample to the amplitude modulated light and a first portion of the microwave waveform; a homodyne circuit comprising a mixer; a differential voltage amplifier; and a lock-in amplifier, wherein: the amplitude modulated light, the first portion of the microwave waveform, and the sample are configured to produce an amplitude modulation signal on the first portion of the microwave waveform, the mixer is configured to receive the amplitude modulation signal and a second portion of the microwave waveform, the mixer is configured to convert the amplitude modulation signal and the second portion of the microwave waveform to a first signal and a second signal, the differential voltage amplifier is configured to convert the first signal and the second signal to a difference signal, the lock-in amplifier is configured to receive the difference signal, the lock-in amplifier is configured to produce a frequency-filtered amplified difference signal based on $\omega_1$, and the frequency-filtered amplified difference signal represents a photoconductivity parameter of the sample.

Example 2. The steady-state microwave conductivity system of Example 1, wherein the amplitude modulated light has a wavelength between about 150 nm and about 2500 nm.

Example 3. The steady-state microwave conductivity system of either Examples 1 or 2, wherein the amplitude modulated light has an intensity between about $10^{10}$ photons/cm$^2$/s/nm and about $10^{16}$ photons/cm$^2$/s/nm.

Example 4. The steady-state microwave conductivity system of any one of Examples 1-3, wherein the light source comprises at least one of a xenon arc lamp, a supercontinuum laser, or a light emitting diode.

Example 5. The steady-state microwave conductivity system of any one of Examples 1-4, further comprising a tunable filter, wherein: the tunable filter is configured to receive a light beam from the light source having a first bandwidth to produce a filtered light having a second bandwidth that is narrower than the first bandwidth.

Example 6. The steady-state microwave conductivity system of any one of Examples 1-5, wherein the second bandwidth is between about 0.1 nm and about 50 nm.

Example 7. The steady-state microwave conductivity system of any one of Examples 1-6, wherein the tunable filter comprises a monochromater having a 1200 g/mm grating.

Example 8. The steady-state microwave conductivity system of any one of Examples 1-7, further comprising a chopper, wherein the chopper is configured to receive the filtered light to produce the amplitude modulated light.

Example 9. The steady-state microwave conductivity system of any one of Examples 1-8, wherein the chopper comprises at least one of a chopper wheel, a liquid crystal shutter, or a Pockel's cell.

Example 10. The steady-state microwave conductivity system of any one of Examples 1-9, wherein $\omega_1$ is between about 1 Hz and 100 MHz.

Example 11. The steady-state microwave conductivity system of any one of Examples 1-10, wherein the homodyne circuit comprises a rectangular waveguide.

Example 12. The steady-state microwave conductivity system of any one of Examples 1-11, wherein the homodyne circuit comprises a coaxial cable.

Example 13. The steady-state microwave conductivity system of any one of Examples 1-12, wherein the microwave resonator has a $TE_{102}$ mode between about 9.8 GHz and 10.0 GHz.

Example 14. The steady-state microwave conductivity system of any one of Examples 1-13, wherein the mixer is a magic tee.

Example 15. The steady-state microwave conductivity system of any one of Examples 1-14, further comprising: a beam splitter; and a reference photodiode, wherein: the beam splitter is configured to receive the amplitude modulated light and direct a portion of the modulated light to the reference diode, the reference diode is configured to produce a frequency reference signal proportional to $\omega_1$, and the reference diode is configured to direct the frequency reference signal to the lock-in amplifier.

Example 16. The steady-state microwave conductivity system of any one of Examples 1-15, wherein: the homodyne circuit further comprises: an E-plane tee; a first isolator; and a second isolator, wherein: the E-plane tee is positioned between the first isolator and the second isolator, the E-plane tee splits the microwave waveform into the first portion of the microwave waveform and the second portion of the microwave waveform, the first portion of the microwave waveform is directed through the first isolator to the sample, and the second portion of the microwave waveform is directed through the second isolator to the magic tee.

Example 17. The steady-state microwave conductivity system of any one of Examples 1-16, wherein the microwave waveform is amplitude modulated to a modulation frequency $\omega_2$.

Example 18. The steady-state microwave conductivity system of any one of Examples 1-17, wherein $\omega_2$ is between about 1 GHz and 100 GHz.

Example 19. The steady-state microwave conductivity system of any one of Examples 1-18, wherein $\omega_2$ is between about 8.2 GHz and about 12.4 GHz.

Example 20. The steady-state microwave conductivity system of any one of Examples 1-19, wherein the amplitude modulation signal is determined by at least one of $\omega_1+\omega_2$ or $\omega_1-\omega_2$.

Example 21. The steady-state microwave conductivity system of any one of Examples 1-20, wherein the first signal is determined by at least one of $-(\omega_1+\omega_2)$ or $-(\omega_1-\omega_2)$.

Example 22 The steady-state microwave conductivity system of any one of Examples 1-21, wherein the second signal is determined by at least one of $(\omega_1+\omega_2)$ or $(\omega_1-\omega_2)$.

Example 23. The steady-state microwave conductivity system of any one of Examples 1-22, wherein the photoconductivity parameter is a photoconductance $\Delta G$.

Example 24. The steady-state microwave conductivity system of any one of Examples 1-23, wherein $\Delta G$ is determined by, $$\Delta G = -\frac{1}{K}\frac{\Delta P}{P},$$

where K is a sensitivity factor of the microwave cavity, $\Delta P$ is a first microwave power reflected from at least one of the sample, the microwave resonator, or the antenna, and P is a second microwave power reflected from at least one of the sample, the microwave resonator, or the antenna.

Example 25. The steady-state microwave conductivity system of any one of Examples 1-24, wherein the photoconductivity parameter comprises $\Delta G$ plotted versus a wavelength of the amplitude modulated light.

Example Set 3

Example 1. A steady-state microwave conductivity method comprising: modulating a light beam to form an amplitude modulated light having a modulation frequency $\omega_1$; producing a microwave waveform; exposing a sample to the amplitude modulated light and a first portion of the microwave waveform to produce an amplitude modulation signal on the first portion of the microwave waveform; mixing a second portion of the microwave waveform and the amplitude modulation signal to produce a first signal and a second signal; converting the first signal and the second signal to a difference signal; and creating a frequency-filtered amplified difference signal based on $\omega_1$, wherein: the frequency-filtered amplified difference signal represents a photoconductivity parameter of the sample.

Example 2. The steady-state microwave conductivity method of Example 1, wherein the amplitude modulated light has a wavelength between about 150 nm and about 2500 nm.

Example 3. The steady-state microwave conductivity method of either Examples 1 or 2, wherein the amplitude modulated light has an intensity between $10^{10}$-$10^{16}$ photons/cm$^2$/s/nm.

Example 4. The steady-state microwave conductivity method of any one of Examples 1-3, further comprising: producing the light beam using a light source comprising at least one of a xenon arc lamp, a supercontinuum laser, or a light emitting diode.

Example 5. The steady-state microwave conductivity method of any one of Examples 1-4, further comprising: filtering the light beam produced by the light source to create a filtered light, wherein: the light beam produced by the light has a first bandwidth, and the filtered light has a second bandwidth that is narrower than the first bandwidth.

Example 6. The steady-state microwave conductivity method of any one of Examples 1-5, wherein the second bandwidth is between about 0.1 nm and about 50 nm.

Example 7. The steady-state microwave conductivity method of any one of Examples 1-6, wherein filtering is performed using a tunable filter.

Example 8. The steady-state microwave conductivity method of any one of Examples 1-7, wherein the tunable filter comprises a monochromater having a 1200 g/mm grating.

Example 9. The steady-state microwave conductivity method of any one of Examples 1-8, further comprising chopping the filtered light to create the amplitude modulated light.

Example 10. The steady-state microwave conductivity method of any one of Examples 1-9, wherein the chopping is performed using a chopper.

Example 11. The steady-state microwave conductivity method of any one of Examples 1-10, wherein the chopper comprises at least one of a chopper wheel, a liquid crystal shutter, or a Pockel's cell.

Example 12. The steady-state microwave conductivity method of any one of Examples 1-11, wherein $\omega_1$ is between about 1 Hz and 100 MHz.

Example 13. The steady-state microwave conductivity method of any one of Examples 1-12, wherein the exposing comprises placing the sample in a microwave resonator.

Example 14. The steady-state microwave conductivity method of any one of Examples 1-13, wherein the microwave resonator has a $TE_{102}$ mode between about 9.8 GHz and 10.0 GHz.

Example 15. The steady-state microwave conductivity method of any one of Examples 1-14, wherein the exposing comprises: impinging the microwave waveform onto the sample using an antenna; and receiving the amplitude modulation signal using the antenna.

Example 16. The steady-state microwave conductivity method of any one of Examples 1-15, wherein the mixing is performed using a magic tee.

Example 17. The steady-state microwave conductivity method of any one of Examples 1-16, further comprising: splitting the amplitude modulated light into a first portion and a second portion; directing the first portion to a reference photodiode; and directing the second portion to the sample, wherein: the first portion is between 5% and 15%, and the reference photodiode produces a frequency reference signal proportional to $\omega_1$.

Example 18. The steady-state microwave conductivity method of any one of Examples 1-17, wherein the creating the frequency-filtered amplified difference signal further comprises the frequency reference signal.

Example 19. The steady-state microwave conductivity method of any one of Examples 1-18, further comprising: splitting the microwave waveform into the first portion of the microwave waveform and the second portion of the microwave waveform; directing the first portion of the microwave waveform through a first isolator to the sample, and directing the second portion of the microwave waveform through a second isolator to the magic tee.

Example 20. The steady-state microwave conductivity method of any one of Examples 1-19, wherein the splitting is performed using an E-plane tee.

Example 21. The steady-state microwave conductivity method of any one of Examples 1-20, wherein at least one of the directing the first portion of the microwave waveform or directing the second portion of the microwave waveform is performed using at least one of a coaxial cable or a rectangular waveguide.

Example 22. The steady-state microwave conductivity method of any one of Examples 1-21, further comprising amplitude modulating the microwave waveform to a modulation frequency $\omega_2$ to produce an amplitude modulated waveform.

Example 23. The steady-state microwave conductivity method of any one of Examples 1-22, wherein the amplitude modulation signal is determined by at least one of $\omega_1+\omega_2$ or $\omega_1-\omega_2$.

Example 24. The steady-state microwave conductivity method of any one of Examples 1-23, wherein the first signal is determined by at least one of $-(\omega_1+\omega_2)$ or $-(\omega_1-\omega_2)$.

Example 25. The steady-state microwave conductivity method of any one of Examples 1-24, wherein the second signal is determined by at least one of $(\omega_1+\omega_2)$ or $(\omega_1-\omega_2)$.

Example 26. The steady-state microwave conductivity method of any one of Examples 1-25, further comprising calculating the photoconductivity parameter as a photoconductance $\Delta G$.

Example 27. The steady-state microwave conductivity method of any one of Examples 1-26, wherein $\Delta G$ is determined by, $$\Delta G = -\frac{1}{K}\frac{\Delta P}{P}$$

where K is a sensitivity factor of the microwave cavity, $\Delta P$ is a first microwave power reflected from at least one of the sample, the microwave resonator, or the antenna, and P is a second microwave power reflected from at least one of the sample, the microwave resonator, or the antenna.

Example 28. The steady-state microwave conductivity method of any one of Examples 1-27, wherein the calculating comprises plotting $\Delta G$ versus a wavelength of the amplitude modulated light.

Example 29. The steady-state microwave conductivity method of any one of Examples 1-28, wherein $\omega_2$ is between about 1 GHz and 100 GHz.

Example 30. The steady-state microwave conductivity method of any one of Examples 1-29, wherein $\omega_2$ is between about 8.2 GHz and about 12.4 GHz.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A steady-state microwave conductivity method comprising:
    modulating a light beam to form a modulated light having a modulation frequency $\omega_1$;
    producing a microwave waveform;
    exposing a sample to the modulated light and a first portion of the microwave waveform to produce an amplitude modulated waveform;
    mixing a second portion of the microwave waveform and the amplitude modulated waveform to produce at least one of a first signal or a second signal; and
    creating a frequency-filtered difference signal based on $\omega_1$, wherein:
    the first signal is produced from constructive interference of the amplitude modulated waveform with the second portion of the microwave waveform,
    the second signal is produced from destructive interference of the amplitude modulated waveform with the second portion of the microwave waveform,
    the frequency-filtered difference signal is calculated from at least one of subtracting the first signal from the second signal or measuring a difference signal resulting from the destructive interference, and
    the frequency-filtered difference signal represents a photoconductivity parameter of the sample.

2. The steady-state microwave conductivity method of claim 1, further comprising producing the light beam using a light source comprising at least one of a xenon arc lamp, a supercontinuum laser, or a light emitting diode.

3. The steady-state microwave conductivity method of claim 2, further comprising:
    filtering the light beam produced by the light source to create a filtered light, wherein:
    the light beam produced by the light source has a first bandwidth, and
    the filtered light has a second bandwidth that is narrower than the first bandwidth.

4. The steady-state microwave conductivity method of claim 3, further comprising chopping the filtered light to create the modulated light.

5. The steady-state microwave conductivity method of claim 1, wherein the exposing comprises placing the sample in a microwave resonator.

6. The steady-state microwave conductivity method of claim 1, wherein the exposing comprises:
    impinging the microwave waveform onto the sample using a first antenna; and
    receiving the amplitude modulated waveform using a second antenna, wherein:
    the first antenna may be the same as the second antenna or the first antenna may be an antenna distinct from the first antenna.

7. The steady-state microwave conductivity method of claim 1, further comprising:
    splitting the modulated light into a first portion and a second portion;
    directing the first portion of the modulated light to a reference photodiode; and directing the second portion of the modulated light to the sample, wherein:

the first portion of the modulated light is between 5% and 15% of the modulated light, and the reference photodiode produces a frequency reference signal proportional to $\omega_1$.

8. The steady-state microwave conductivity method of claim 1, further comprising:

splitting the microwave waveform into the first portion of the microwave waveform and the second portion of the microwave waveform;

directing the first portion of the microwave waveform to the sample; and directing the second portion of the microwave waveform to the mixing.

9. The steady-state microwave conductivity method of claim 8, further comprising, after producing the microwave waveform and before the mixing, shifting the second portion of the microwave waveform between zero degrees and 180 degrees.

10. The steady-state microwave conductivity method of claim 1, further comprising:

producing the microwave waveform using a microwave source; and modulating the microwave waveform at the microwave source to a separate frequency $\omega_2$, wherein the photoconductivity parameter is determined by at least one of the difference of $\omega_1$ and $\omega_2$ or the sum of $\omega_1$ and $\omega_2$.

11. The steady-state microwave conductivity method of claim 1, further comprising calculating the photoconductivity parameter as a photoconductance $\Delta G$.

12. The steady-state microwave conductivity method of claim 11, wherein the calculating comprises:

$$\Delta G = -\frac{1}{K}\frac{\Delta P}{P},$$

where K is a sensitivity factor of a microwave resonator or an antenna, $\Delta P$ is a first microwave power reflected from at least one of the sample, the microwave resonator, or the antenna, and P is a second microwave power reflected from at least one of the sample, the microwave resonator, or the antenna.

13. The steady-state microwave conductivity method of claim 11, wherein the calculating comprises plotting $\Delta G$ versus a wavelength of the modulated light.

14. The steady-state microwave conductivity method of claim 1, wherein the microwave waveform has a frequency between about 1 GHz and about 100 GHz.

15. The steady-state microwave conductivity method of claim 1, wherein the microwave waveform has a frequency between about 8.2 GHz and about 12.4 GHz.

16. The steady-state microwave conductivity method of claim 1, further comprising, after producing the microwave waveform rotating a polarization axis of the first portion of the microwave waveform by 90 degrees.

17. The steady-state microwave conductivity method of claim 1, further comprising, prior to the exposing and the mixing, splitting the microwave wave form into the first portion and the second portion, wherein after the splitting, neither the first portion or the second portion are amplified prior to the exposing and mixing.

18. The steady-state microwave conductivity method of claim 1, wherein the sample comprises a thin film comprising at least one of a perovskite, an OPV, a CIGS, or CdTe.

* * * * *